US006822712B2

(12) United States Patent
Suzuki et al.

(10) Patent No.: US 6,822,712 B2
(45) Date of Patent: Nov. 23, 2004

(54) REFLECTION LIQUID CRYSTAL DISPLAY, METHOD FOR PRODUCING THE SAME, AND METHOD FOR DRIVING THE SAME

(75) Inventors: Masayoshi Suzuki, Tokyo (JP); Teruaki Suzuki, Tokyo (JP); Toshiya Ishii, Tokyo (JP)

(73) Assignees: NEC Corporation, Tokyo (JP); NEC LCD Technologies, Ltd., Kanagawa (JP)

( * ) Notice: Subject to any disclaimer, the term of this patent is extended or adjusted under 35 U.S.C. 154(b) by 322 days.

(21) Appl. No.: 09/938,661

(22) Filed: Aug. 27, 2001

(65) Prior Publication Data

US 2002/0047965 A1 Apr. 25, 2002

(30) Foreign Application Priority Data

Aug. 29, 2000 (JP) ........................................ 2000-259989

(51) Int. Cl.$^7$ ............................................. G02F 1/1335
(52) U.S. Cl. ........................ 349/115; 349/106; 349/176; 349/96
(58) Field of Search ............................. 349/86, 96, 104, 349/106, 115, 175, 176, 185, 113

(56) References Cited

U.S. PATENT DOCUMENTS 6,226,461 B1 * 5/2001 Homma et al. ............. 396/150
6,295,108 B1 * 9/2001 Kaneko ...................... 349/115
6,551,667 B2 * 4/2003 Kubota et al. ............... 428/1.1

FOREIGN PATENT DOCUMENTS

| JP | 6-59287 | 3/1994 |
|----|---------|--------|
| JP | 7-239471 | 9/1995 |
| JP | 10-20323 | 1/1998 |
| JP | 10-197844 | 7/1998 |
| JP | 11-202302 | 7/1999 |
| KR | 2000-29063 | 5/2000 |

OTHER PUBLICATIONS

T. Sonehara et al., "A New Twisted Nematic ECB (TN–ECB) Mode for a Reflective Light Valve".
M. Schadt et al., "Optically Structured Multidomain LCDs with Broad Field of View and Ferroelectric LCDs with Large Cell Gap".
R. Maurer et al., "Polarizing Color Filters Made From Cholesteric LC Silicones".

* cited by examiner

Primary Examiner—Tom Thomas
Assistant Examiner—N. Drew Richards
(74) Attorney, Agent, or Firm—Young & Thompson

(57) ABSTRACT

A reflection liquid crystal display is such that a transparent substrate is opposed to the first substrate with a liquid crystal layer placed therebetween, and the transparent substrate is disposed forward to the first substrate in the light-incident direction. A quarter-wavelength plate is disposed in the transparent substrate, and a polarization plate is disposed on the surface at the forward side thereof in the light-incident direction. And, a reflection layer besides acting as a color filter consisting of a cholesteric liquid crystal is disposed inside liquid crystal cells of the first substrate. In the case of a wide field-of-view angle, a scattering film is disposed forward to the polarization plate in the light-incident direction.

25 Claims, 14 Drawing Sheets

REFLECTION LIQUID CRYSTAL DISPLAY, METHOD FOR PRODUCING THE SAME, AND METHOD FOR DRIVING THE SAME

BACKGROUND OF THE INVENTION

1. Technical Field of the Invention

The present invention relates to a reflection liquid crystal display such as a display for a mobile terminal device, a terminal display for utilizing various types of media for individuals, a display of a mobile telephone, and a display in an amusement device such as a game machine, a method for producing the same, and a method for driving the same. More specifically, this invention relates to a reflection liquid crystal display having excellent field-of-view angle characteristics, the production process of which is facilitated, a method for producing the same and a method for driving the same.

2. Description of the Related Art

Recently, demand for a reflection liquid crystal display, power consumption of which is reduced, has increased in line with development and diversification of mobile devices. Such a display that enables color display has been increasingly desired for use in, particularly, mobile telephone sets, mobile terminals, and office automation devices. A brighter display is further required in view of mobility, and reasonably wide field-of-view angle characteristics are required. Especially preferable, since narrow field-of-view angle characteristics are desired in an individual use although wide field-of-view angle characteristics are desired where a plurality of people observes a display, a reflection liquid crystal display that enables a changeover between a wide field-of-view angle and a narrow field-of-view angle is desired.

Conventionally, such types are widely used in reflection liquid crystal displays, in which a polarization plate is used as in a supertwisted nematic type (STN type) or twisted nematic type (TN type) that has been widely used in transmission type liquid crystal displays. In the case of reflection type, only a single polarization plate is used, differing from the transmission type. However, since it is necessary to switch reflection light, such a type is common, which is a so called single polarization plate used along with a quarter-wavelength plate as described in, for example, T. Sonehara et al., Japan Display 1989, Page 192 (1989).

A description is given of a display principle of a single polarization plate type, taking a normally white type, which has been most widely used, as an example (Prior art example 1). FIG. 1A and FIG. 1B are views showing the display principle of a reflection type liquid crystal element of a prior art single polarization plate type, wherein FIG. 1A shows an example in the case of white display, and FIG. 1B shows an example in the case of black display. Also, FIG. 1A and FIG. 1B show only optical elements of the reflection liquid crystal display.

As shown in FIG. 1A, incident non-polarized light 1107 is brought into collision with a reflection plate 1104 after having passed through a quarter-wavelength plate 1102 of a wide-band and passed through a liquid crystal layer 1103 and returns in its inverted optical route, and, when the light passes through the polarization plate 1101, it enters eyes of people, wherein the light can be recognized as an image. At this time, by changing the state of polarization by utilizing electro-optical effects of liquid crystal, switching of the reflection light can be carried out. First, the incident non-polarized light 1107 enters the polarization plate 1101 and is converted to light polarization having a specified vibration direction. At this time, the polarization plate is set so that the outgoing light becomes P-polarized light 1105. And, if the optical axis of the quarter-wavelength plate 1102 is disposed so that it forms 45 degrees with respect to the transmission axis of the polarization plate, the light that has passed through the quarter-wavelength plate 1102 becomes rightward circular-polarized light 1106 and enters the liquid crystal layer 1103. In either the TN mode or the STN mode, retardation of the liquid crystal 1103 is set so that it gives $\lambda/4$, that is, a phase difference $\pi/2$ when no voltage is applied. Therefore, light that has passed through the liquid crystal layer 1103 again becomes P-polarized light 1105 and reaches the reflection plate 1104. In the reflection, since the P-polarized light 1105 is reflected as it is P-polarized light 1105, it returns in a completely inverted optical path of the path along which it entered, and is converted to rightward circular-polarized light 1106 by the liquid crystal layer 1103. Further, the light becomes P-polarized light 1105 by the quarter-wavelength plate 1102 and is caused to radiate from the polarization plate 1101 as it is P-polarized light 1105. That is, white display is enabled in a state where no voltage is applied onto the liquid crystal.

As shown in FIG. 1B, if voltage is applied to the liquid crystal layer 1103 and liquid crystal is erected so that the liquid crystal molecules become perpendicular with respect to its substrate, the retardation of the liquid crystal layer 1103 becomes almost zero, and a phase difference 0 is given. That is, the liquid crystal layer 1103 does not give any influence to the state of polarization. In this state, where incident non-polarized light 1107 enters the polarization plate 1101, light that has passed through the polarization plate 1101 and quarter-wavelength plate 1102 becomes rightward circular-polarized light 1106 as described above. Herein, since voltage is applied onto the liquid crystal layer 1103, the liquid crystal layer 1103 does not change the state of polarization, and the rightward circular-polarized light 1106 passes through the liquid crystal layer 1103 as it is the rightward circular-polarized light 1106 and enters the reflection plate 1104. Since the advancement direction of the light is inverted by reflection, the rightward circular-polarized light 1106 becomes a leftward circular-polarized light 1108 and returns. Since the liquid crystal layer 1103 also does not change the state of polarization, light that passed through the liquid crystal layer 1103 enters the quarter-wavelength plate 1102 as it is a leftward circular-polarized light, and it becomes S polarization 1109 whose direction of polarization is different by 90 degrees from the P-polarized light 1105, wherein the light enters the polarization plate 1101. Since the transmission axis of the polarization plate 1101 is set so that it can make the P-polarized light pass therethrough, wherein the S polarization 1109 cannot pass through the polarization plate 1101, and it is displayed as black. Depending upon the intensity of application voltage, the retardation of the liquid crystal layer 1103 can be varied, wherein intermediate colors can be displayed.

Also, Japanese Unexamined Patent Application No. Hei-10-20323 (hereinafter called a "prior art example 2") has disclosed a liquid crystal display whose production is facilitated and field-of-view angle characteristics are excellent. In the prior art example 2, a liquid crystal layer in which two or more types of slight areas coexist is placed between two substrates, and has an electrode having an opening formed on at least one substrate, and a second electrode (control electrode) secured in the opening, wherein a voltage that is higher than the voltage applied between the electrode having the opening and the electrode opposed thereto is applied between the control electrode and the electrode opposed thereto, thereby securing a wide field-of-view angle.

Further, Japanese Unexamined Patent Publication No. Hei-7-239471 (hereinafter called a "prior art example 3") discloses the use of a cholesteric material layer and phase plate, that act as a reflection layer, for the purpose of improving the brightness and color purity of a reflection liquid crystal display. In the prior art example 3, the upper and lower substrates are disposed so as to be opposed to each other, a liquid crystal layer is placed and secured between these two substrates, and the prior art example 3 comprises a phase plate disposed on the opposite side of the upper substrate liquid crystal layer, an upper polarization plate disposed further thereon, a cholesteric material layer that is disposed on the surface of the lower substrate opposed to the upper substrate and is disposed between the surface and the liquid crystal layer, and an optical absorption layer formed at the opposite side of the lower substrate liquid crystal layer. Thus, the cholesteric material layer is formed in liquid crystal cells and is used as a color filter, whereby shadows in the dark display portion can be removed.

In addition, a liquid crystal display in which a wide field-of-view angle and a narrow field-of-view angle are changed over is disclosed in Japanese Unexamined Patent Application Nos. Hei-6-59287 and Hei-10-197844 (hereinafter respectively called a "prior art example 4" and a "prior art example 5").

In the prior art example 4, the field-of-view angle of transmission liquid crystal cells is changed over by adjusting the outgoing light, utilizing a guest-host liquid crystal or grating. Also, in the prior art example 5, such a method is disclosed, in which the reflection type and transmission type are changed over by utilizing transmission and dispersion of macromolecular dispersion liquid crystal, and the changeover of the field-of-view angle of a liquid crystal display is carried out by utilizing the guest-host liquid crystal.

However, in the case of displaying by means of the mode of prior art example 1, as has been made clear in FIG. 1A, since the light that enters the liquid crystal layer 1103 in bright display is based on linear polarization, in the TN mode or STN mode, it is necessary to set the rubbing direction and polarization direction, so that they are made coincident with each other or different by 90 degrees from each other, in order to obtain a high transmittivity, and it is necessary to accurately control the rubbing direction and arrangement of the polarization plate 1101 and a wide-band quarter-wavelength plate 1102. In addition, if a perpendicular orientation mode and amorphous TN mode, which can shorten the production process without requiring any rubbing, are used, a dark display portion is securely produced in a bright display state, wherein sufficient brightness cannot be obtained. Further, another problem occurs in that, since the field-of-view angle is unitarily determined by design of a reflection plate, the wide field-of-view angle and narrow field-of-view angle cannot be changed over.

Still further, in the art described in the prior art example 2, such problem occurs in that a voltage must be applied to the second electrode in order to control its drive and a wide field-of-view angle and narrow field-of-view angle cannot be switched.

In addition, in the art described in the prior art example 3, in the phase plate, no consideration is taken with respect to the relationship between the direction of liquid crystal orientation and the direction of polarization of reflection light that enters the liquid crystal layer in the TN and STN modes, and no device is provided so that brightness can be secured in regard to fluctuations of a process such as a rubbing direction, etc. In particular, even if a perpendicular orientation mode or amorphous TN mode, which can shorten the production process not requiring any rubbing, is used, no consideration is provided with respect to a method and/or construction of securing sufficient brightness. Therefore, sufficient brightness cannot be secured by such a simple process. Also, where the cholesteric material layer is used as a reflection layer, since the range of field-of-view angle that is capable of observing selection reflection is narrow, it is necessary to further widen the field-of-view angle in practice. However, a problem occurs in that a wide field-of-view angle and a narrow field-of-view angle cannot be changed over.

Still further, in the prior art example 4, it is disclosed only that the outgoing light is adjusted by utilizing a guest-host liquid crystal or grating in order to adjust the field-of-view angle of transmission liquid crystal cells. No disclosure is provided with respect to a reflection type. Furthermore, where the field-of-view angle is changed over by the system disclosed in the prior art example 4, a problem occurs in that, although it is possible to only narrow and/or limit, in a certain area, the field-of-view angle of liquid crystal cells to be used, it is not possible to widen the field-of-view angle of the liquid crystal cells.

In addition, in the prior art example 5, as in the prior art example 4, although it is possible to only narrow and/or limit, in a certain area, the field-of-view angle of liquid crystal cells to be used, it is not possible to widen the field-of-view angle of the liquid crystal cells. Therefore, it is necessary to use a mode in which the field-of-view angle of the liquid crystal cells is wide. A liquid crystal mode having practical brightness and high contrast in the reflection type is only a single polarization plate type of TN as in the prior art example 1. However, another problem occurs in that the field-of-view angle in the mode is narrow, and a practically sufficient field-of-view angle cannot be obtained by the system by which the field-of-view angle is further narrowed.

Therefore, as described above, it is difficult to secure sufficient brightness by a single polarization plate type in which a conventional TN or STN mode is employed. Still further, it is necessary to accurately control the rubbing direction, etc., and tolerance is narrow with respect to fluctuations in the process. In particular, it is impossible to secure sufficient brightness with respect to the perpendicular orientation not requiring any rubbing and the mode of amorphous TN, etc. In addition, still another problem occurs in that the necessary field-of-view angle in practice cannot be secured, and the field-of-view angle cannot be changed over.

SUMMARY OF THE INVENTION

It is therefore an object of the invention to provide a reflection liquid crystal display, having an excellent field-of-view angle, which can display brightly with excellent color purity in a mode of perpendicularly-oriented liquid crystal and amorphous TN, etc., which does not require any rubbing, and can be easily produced, and in which a wide field-of-view angle and a narrow field-of-view angle can be simply changed over, a method for producing the same, and a method for driving the same.

A reflection light crystal display according to the invention comprises: a first substrate; a second transparent substrate disposed at the forward side in the incident direction of light so that it is opposed to the first substrate; a liquid crystal layer secured and placed between said first substrate and second substrate; a color filtering layer consisting of a cholesteric material layer provided between said first substrate and liquid crystal layer; a light absorbing layer secured rearward of said color filtering layer in the incident direction of light at said first substrate side; a quarter-wavelength plate secured at the second substrate side; and a polarization plate disposed further forward of the incident direction of light than the quarter-wavelength plate.

Another reflection liquid crystal display according to the invention comprises: a first substrate; a second transparent substrate disposed forward of the incident direction of light so that it is opposed to the first substrate; a liquid crystal layer secured and placed between said first substrate and second substrate; a color filtering layer consisting of a cholesteric material layer provided between said first substrate and said liquid crystal layer; a light absorbing layer secured rearward of said color filtering layer in the incident direction of light at said first substrate side; a three-color cholesteric material layer, which is provided at the second substrate side and has an inverted twist of that of said cholesteric material layer.

In the present invention, light that enters the liquid crystal layer is subjected to circular polarization without fail, the intensity of light radiating from the liquid crystal layer is not influenced by the direction of orientation of liquid crystal on the plane parallel to the substrate surface. Therefore, a bright white display is enabled regardless of the direction and angle of the liquid crystal. As a result, in the TN or STN mode, even if the rubbing direction slips in the process of production, this does not influence the display at all. In addition, in modes not requiring any rubbing such as the perpendicular orientation mode or amorphous TN mode, blackening portions will not be produced in the white display as in the prior arts. Therefore, a remarkably bright display is enabled in comparison with the prior arts. Further, it is enough that the liquid crystal layer has a function by which retardation (d$\Delta$n), which is a product obtained by multiplying the refractive index anisotropy $\Delta$n of liquid crystal molecules by the thickness d of the liquid crystal layer, is changed by $\lambda/2$ (with a phase difference $\pi$). Therefore, even in a high-speed mode other than the abovementioned, this can be used without any necessity of accurate control in the rubbing direction.

Also, in the present invention, it is preferable that the invention is provided with a scattering layer that scatters light forward of the incident direction of light of said polarization plate or forward of the incident direction of light of said three-color cholesteric material layer. Said scattering layer has two transparent electrodes disposed so as to be opposed to each other and a macromolecular dispersion liquid crystal layer placed and secured between these transparent electrodes, and may be such a type that can change over transmission and dispersion of said macromolecular dispersion type liquid crystal layer by applying voltage to said macromolecular dispersion liquid crystal layer. A wide field-of-view angle and a narrow field-of-view angle can be changed over by attaching or detaching a scattering film or switching the macromolecular dispersion liquid crystal layer. In particular, in the present invention, since a color filtering layer consisting of a cholesteric material layer is provided at the side where the liquid crystal layer of the first substrate exists, a problem of so-called parallax does not occur. In addition thereto, in the invention, since the color filtering layer consisting of a cholesteric material layer is provided at the side where the liquid crystal layer of the first substrate exists, and the direction of selection reflection of the cholesteric material is limited to a specified direction, only automatically collimated light is reflected on the scattering layer. Therefore, no problem in view of parallax does occur, wherein it is possible to obtain a wide field-of-view angle. To secure a narrow field-of-view angle, such adjustment may be carried out, by which the scattering is removed or the angle of dispersion is reduced. In the case where only a reflection plate consisting of a cholesteric material layer is used, a narrow field-of-view angle limited in only the direction of selection reflection can be made into a wide field-of-view angle which is sufficient in practice, by using a scattering film or a macromolecular dispersion liquid crystal layer.

Further, the invention may be provided with a plurality of scanning signal lines secured on the surface of said first substrate opposed to said second substrate and a plurality of picture signal lines disposed on these scanning signal lines in the form of a matrix, a plurality of thin-film transistors formed so as to correspond to the intersection of said scanning signal lines and said picture signal lines, at least one pixel that is constituted by an area surrounded by said plurality of scanning signal lines and picture signal lines, pixel electrodes that are connected to said thin-film transistor corresponding to respective pixels and are formed rearward of said liquid crystal layer in the incident direction of light, and a common electrode that is formed forward of said liquid crystal layer in the incident direction of light and applies a reference voltage to said plurality of pixels. Thereby, since pixel electrodes are disposed between the color filtering layer and liquid crystal layer, alignment between the color filtering layer and pixel electrodes is no longer required, wherein the overlapping accuracy of the first and second substrates can be remarkably relieved. Still further, since the pixel electrodes are disposed between the color filtering layer and the liquid crystal layer, influence of an electric field in the lateral direction from the scanning signal electrodes and picture signal electrodes can be remarkably relieved.

In addition, in at least either one of said scanning signal electrode or said picture signal electrode, a part of said pixel electrodes or a shielding electrode may be disposed forward in the incident direction of light. Thus, in the case of an active matrix liquid crystal display, by disposing a shielding electrode above at least either one of the scanning signal electrode or picture signal electrode, no influence is received in the lateral direction from the scanning signal electrode and picture signal electrode.

Also, the above pixel electrodes may be circular or equilaterally polygonal to have more sides than those of a triangle, and said common electrode has a larger area, when being observed from right above, than that of said common electrode, and is formed at a position where it can cover up the entirety of said pixel electrode. Further, said pixel electrode is shaped so that a plurality of circles or equilateral polygons which have more sides than those of a triangle range one after another while the common electrode may have a larger area, when being observed from right above, than that of said pixel electrode and is formed at a position where it covers up the entirety of said pixel electrode. Still further, said common electrode may be formed on almost the entire surface of said second substrate.

In addition, said pixel electrode is provided with cuts formed at equidistant positions on the circumference or at the corners of a polygon, or may be provided with projections protruding outward at equidistant positions on the circumference or at the corners of a polygon, or a recess may be formed at a part of said pixel electrode.

Thereby, it is possible to orient and divide liquid crystal cells as necessary, in view of the field-of-view angle characteristics when being used in a narrow field-of-view angle, uniformity of the brightness on the panel surface, and response rate, etc. As described above, where voltage is applied between such electrodes, oblique electric fields are produced up and down with symmetry well secured. For example, in liquid crystal having a dielectric constant of negative anisotropy (dielectric anisotropy, which is perpendicularly oriented, the number of directions along no voltage is applied, said liquid crystal layer in the respective pixels may have two or more types of minute areas in which the rise directions of liquid crystal molecules differ from each other, or said liquid crystal layer in the respective pixels may have two or more types of minute areas in which the twisting directions of the liquid crystal molecules differs from each other, or said liquid crystal layer in the respective pixels may have four types of minute areas in which the twisting direction and rise direction of liquid crystal molecules differ from each other. In this case, it is preferable that the pre-tilt angle of the liquid crystal molecules in the boundary phase between said first substrate and second substrate is 1 degree or less.

In this case, the pixel electrode is shaped so as to have good symmetry, the common electrode covers the entirety of the upper part of the pixel electrode when being observed from above, and is formed so that its area becomes larger than that of the pixel electrode, wherein, when voltage is applied between the pixel electrode and the common electrode, an oblique electric field is produced in the liquid crystal layer with good symmetry secured due to the shape characteristics of the upper and lower electrodes. Although there is a possibility that both rightward twist and leftward twist are generated in respective parts of the pixels, one of the twisting directions is preferentially produced in an area where respective pixels are divided, and the state of orientation is automatically produced, and in the case of twisted nematic orientation, pixel division which liquid crystal molecules fall down becomes two or more, wherein it becomes possible to smoothly orient and divide liquid crystal in pixels. That is, a boundary of division is produced at the center of a pixel due to an oblique electric field that is naturally produced, and liquid crystal molecules are caused to fall down from the end of the pixel electrode toward the middle. If the shape of the pixel electrode is made symmetrical, liquid crystal molecules are caused to naturally fall down from respective sides of the pixel electrode toward the middle thereof. Therefore, they are naturally divided. Polygons are not necessarily made equilateral, wherein some deformation may be permitted.

Further, said liquid crystal layer may include macromolecular organic compounds.

Still further, in said liquid crystal layer, the anisotropy of the dielectric constant of liquid crystal is negative, when no voltage is applied, liquid crystal molecules may be oriented in a direction along which the liquid crystal molecules are made orthogonal to said first substrate and second substrate.

In this case, it is preferable that said liquid crystal layer is given a pre-tilt angle in advance in the direction along which the liquid crystal molecules fall down when voltage is applied.

Also, in said liquid crystal layer, the anisotropy of the dielectric constant of liquid crystal is positive, and it may be such that it has a twisted nematic structure when having good symmetry can be naturally secured. Also, a chiral agent may be provided in the liquid crystal layer. In this case, two-divided TNs having only a different rise direction are secured, wherein it becomes possible to orient and divide liquid crystal in the pixels.

In addition, in said liquid crystal layer, the anisotropy of the dielectric constant of liquid crystal is positive, and the liquid crystal layer has a homogeneous structure when no voltage is applied. Said liquid crystal layer of the respective pixels has two or more types of minute areas in which the rise directions of the liquid crystal molecules differ from each other. In this case, it is preferable that the pre-tilt angle of the liquid crystal molecules on the boundary phase between said first substrate and second substrate is 1 degree or less.

In this case, the pixel electrode is shaped so as to have good symmetry, and the common electrode covers the entirety of the upper part of the pixel electrode when being observed from above, and is formed so that its area becomes larger than that of the pixel electrode. If voltage is applied between the pixel electrode and the common electrode, an oblique electric field is produced with good symmetry secured. Since the direction orientation of liquid crystal is regulated on the boundary phase between the substrates, two types of domains in which the rise directions differ from each other are produced. In the case of homogeneous orientation, it is preferable that a recess is provided at the middle of the pixel electrode particularly in order to stabilize the boundary phase.

A method for producing a reflection liquid crystal display according to the invention comprises the steps of: forming a thin film transistor on a first substrate; forming an optical absorption layer on said first substrate; forming a color filtering layer consisting of a cholesteric material layer on said optical absorption layer; forming a pixel electrode on said color filtering layer and connecting the same to said thin-film transistor; forming a common electrode on a second substrate; making a pixel electrode of said first substrate and a common electrode of said second substrate be opposed to each other, and forming a liquid crystal layer including a macromolecular organic compound between said first substrate and second substrate; forming a quarter-wavelength plate on said second substrate; and forming a polarization plate on said quarter-wavelength plate; wherein the process of forming said liquid crystal layer includes a process for pouring liquid crystal including monomer or oligomer between said first substrate and second substrate, and a process of making said monomer and oligomer macromolecular in liquid crystal.

In the invention, by making polymerizable monomer or oligomer, which is mixed in liquid crystal at a slight ratio, the macromolecular organic compound after the initial orientation is controlled by applying voltage between the common electrode and pixel electrode, whereby the beginning liquid crystal orientation can be made further secure. When controlling the initial orientation, the temperature may be lowered while applying voltage between the common electrode and pixel electrode after the liquid crystal layer is made isotropic by heating, or it is sufficient that voltage may be applied between the common electrode and pixel electrode at room temperature. Also, a reaction of making the monomer macromolecular may be carried out before and during heating in an isotropic phase, and after cooling down. Where voltage is applied between the common electrode and pixel electrode at room temperature and initial orientation is controlled, the reaction may be caused to occur before or after voltage is applied. Thus, it is possible to orient and divide liquid crystal in the form of normal drive.

A process of forming a pre-tilt angle in liquid crystal molecules by light irradiation may be provided after the process of forming said liquid crystal layer.

In addition, said light irradiation may be carried out by oblique irradiation of light with respect to said first substrate and second substrate, by oblique irradiation of polarized light with respect to said first substrate and second substrate, or by irradiation of polarized light from the perpendicular direction with respect to said first substrate and second substrate. Thereby, the pre-tilt angle is controlled in advance on the substrates in compliance with a division shape by using a method of orienting light, etc., wherein the control of the initial orientation can be remarkably and securely carried out. And, an effect of an oblique electric field and an effect of the pre-tilt angle synergetically operate, wherein the division orientation can be remarkably more effectively carried out than in the case of only either of them.

A method for driving a reflection liquid crystal display according to the invention is featured in that the display can dot-invertedly drive in a reflection liquid crystal display described in any one of claims 1 through 25.

In the invention, there is no problem in normal cases if the interval between pixels is sufficiently separated from each other as regards division. However, especially, in a case where pixels approach each other due to limitations in design, a state of generation of an oblique electric field is made further preferable by carrying out so-called dot-inverted drive in which the polarities (positive and negative) of the voltage applied onto respective pixels adjacent to each other are inverted when driving the display, whereby more satisfactory division is enabled.

A method for driving another reflection liquid crystal display according to the invention is featured in that a black state is enabled before one frame is finished, in a reflection liquid crystal display described in any one of claims 1 through 25, wherein separation or cut of moving pictures can be further improved.

BRIEF DESCRIPTION OF THE DRAWINGS

FIG. 1A and FIG. 1B are views showing the display principle of a prior art reflection liquid crystal element of a single polarization plate type, wherein FIG. 1A is an exemplary view of a white display, and FIG. 1B is an exemplary view of a black display;

FIG. 2A and FIG. 2B are views showing the principle of the present invention, wherein FIG. 2A is an exemplary view showing an OFF (dark) state of a reflection liquid crystal display, and FIG. 2B is an exemplary view showing an ON (bright) state of the reflection liquid crystal display;

FIG. 6A and FIG. 6B are sectional views showing a reflection liquid crystal display according to a third embodiment of the invention, wherein FIG. 6A shows a state where no voltage is applied onto a macromolecular dispersion liquid crystal layer, and FIG. 6B shows a state where voltage is applied onto a macromolecular dispersion liquid crystal layer;

DETAILED DESCRIPTION OF THE PREFERRED EMBODIMENTS

Figure 1A:
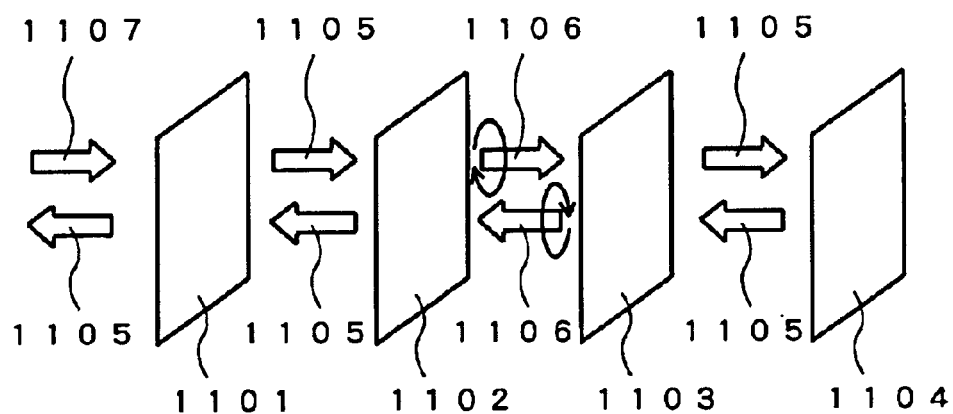

Hereinafter, a detailed description is given of preferred embodiments according to the invention. A reflection liquid crystal display according to the present invention is featured in that a liquid crystal layer is placed and secured between two substrates, a color filtering layer consisting of at least one cholesteric material layer is disposed between the first substrate and second substrate, an optical absorption layer is disposed rearward of the color filtering layer in the incident direction of light of the first substrate, a wide-band quarter-wavelength plate is disposed at the second substrate side, and further a polarization plate is further forward in the incident direction of light than the quarter-wavelength plate. In this case, although the quarter-wavelength plate and polarization plate may be disposed at any side of the second substrate, it is preferable that they are installed for the sake of ease in production at the side where no liquid crystal of the second substrate exists, that is, outside the liquid crystal cells.

Also, if a three-prime-color cholesteric material layer having an inverted twist of the cholesteric material layer that is disposed in the first substrate is used instead of a combination of a wide-band quarter-wavelength plate and a polarization plate, an effect can be brought about, which is similar to the case where the combination of said wide-band quarter-wavelength plate and polarization plate has been used. The three-prime-color cholesteric material layer may be disposed at either of the surface at the forward side (outside the liquid crystal cell) in the incident direction of light of the second substrate or the surface at the rearward side (inside the liquid crystal cell) in the incident direction of light of the second substrate.

Further preferably, a reflection liquid crystal display according to the invention is featured in having a scattering film on the surface at a further forward side in the incident direction of light than the polarization plate or three-prime-color cholesteric material layer. In order to simply change a wide field-of-view angle to a narrow field-of-view angle or vice versa, it is preferable that the scattering film can be easily attached and detached. Also, in order to simply change a wide field-of-view angle to a narrow field-of-view angle or vice versa, a scattering film may be constituted by a macromolecular dispersion liquid crystal layer, wherein a wide field-of-view angle and a narrow field-of-view angle may be changed over by turning ON and OFF the voltage so that a scattered state (a wide field-of-view angle) is effected with no voltage applied, and a transmitted state (a narrow field-of-view angle) is effected with voltage applied.

In either case, it is important that the second substrate has a wide-band quarter-wavelength plate and a polarization plate, and a color filtering layer consisting of a cholesteric material layer is provided at the side where the liquid crystal layer of the first substrate exists, that is, in the liquid crystal cell. At this time, the cholesteric material layer operates as a color filtering layer, whereby it is possible to secure a bright display free from any parallax, which cannot be obtained by any of the prior art methods.

Next, a description is given of the operation principle of a liquid crystal display according to the present invention that can bring about said effects.

Figure 2A:
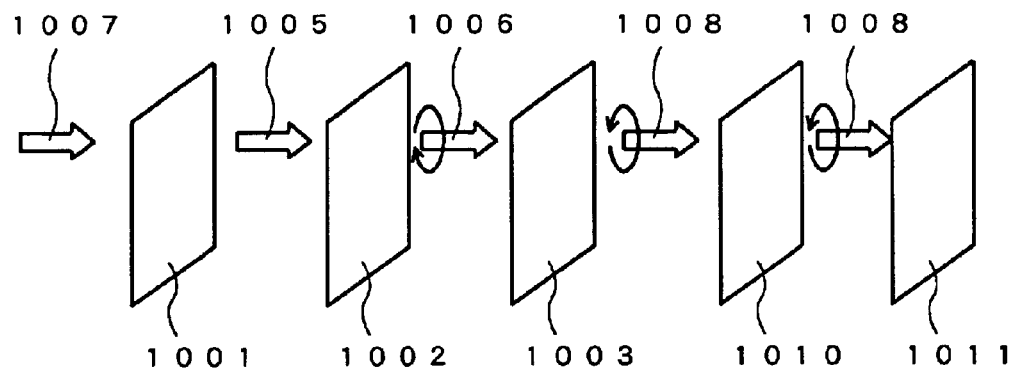
Figure 2B:
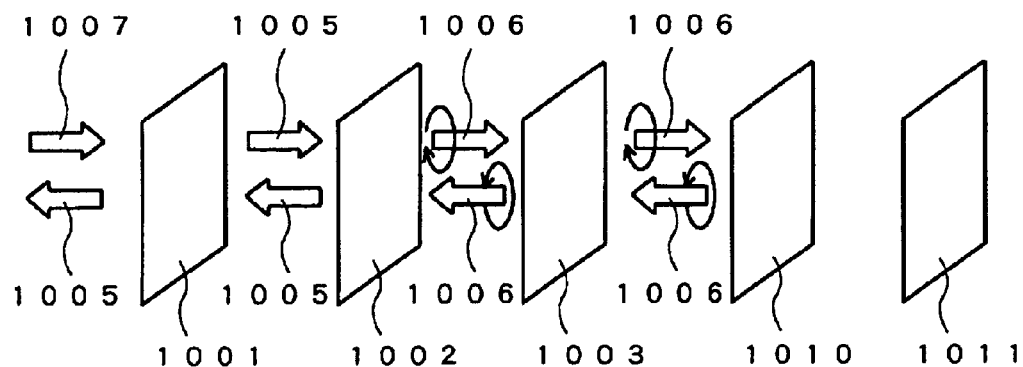

In the invention, in a case where a TN or STN mode is used, a normally black mode is brought about, in which an OFF (dark) state is effected when voltage is 0, and an ON (bright) state is effected when voltage is applied. FIG. 2A and FIG. 2B are views that explain the principle of the invention, wherein FIG. 2A is an exemplary view showing an OFF (dark) state of a reflection liquid display, and FIG. 2B is an exemplary view showing an ON (bright) state of the reflection liquid crystal display. Also, in the present embodiment, a description is given of a case where a reflection plate and a quarter-wavelength plate are disposed outside the liquid crystal cell. Incident light 1007 passes through a polarization plate 1001, a quarter-wavelength plate 1002, and a liquid crystal layer 1003 in order, and in a dark state, the light passes through a color filtering layer 1010 and is absorbed in an optical absorbing body 1011. Also, in a bright state, the light is reflected by the color filtering layer 1010 and is caused to radiate in the reverse route of the above.

Figure 1B:
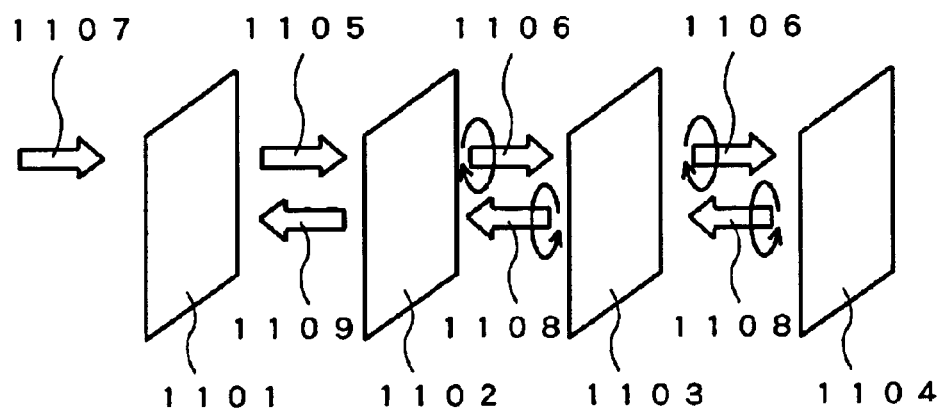

When no voltage is applied to the liquid crystal layer 1003, as shown in FIG. 2A, non-polarized incident light 1007 enters the polarization plate 1001 as in FIG. 1A and FIG. 1B and is converted to polarized light having a specified direction of oscillation. At this time, the polarization plate 1001 is set so that the outgoing light becomes P-polarized light 1005. And, if the optical axis of the quarter-wavelength plate 1002 into which the P-polarized light 1005 is incident is disposed so that it forms 45 degrees with respect to the transmission axis of the polarization plate, the light that passed through the quarter-wavelength plate 1002 becomes a rightward circular-polarized light 1006, and enters the liquid crystal layer 1003. In the invention, in both the TN mode and STN mode, retardation of the liquid crystal layer 1003 is set so that $\lambda/2$, that is, a phase difference $\pi$ is given when no voltage is applied. Therefore, the light that passed through the liquid crystal layer 1003 becomes a leftward circular-polarized light 1008 and reaches the reflection plate 1010 consisting of a cholesteric liquid crystal. Herein, if the rightward-twisted cholesteric material layer is used, the leftward circular-polarized light 1008 passes through the reflection layer 1010, and is absorbed by the optical absorption body 1011, wherein a black display is brought about.

Further, as in FIG. 1B, as shown in FIG. 2B, if voltage is applied to the liquid crystal layer 1003 and liquid crystal molecules are caused to be erect so that they become perpendicular with respect to the substrate, the retardation of the liquid crystal layer 1003 becomes almost zero, and a phase difference 0 is given. In this state, even if the rightward circular-polarized light 1006 enters the liquid crystal layer 1003, the liquid crystal layer 1003 does not influence a state of polarization, and the light that passed through the liquid crystal layer 1003 reaches to the reflection layer 1010 consisting of cholesteric liquid crystal as it is a rightward circular-polarized light 1006. At this time, by the reflection plate consisting of rightward-twisted cholesteric liquid crystal, the rightward circular-polarized light 1006 is reflected and is returned after it is made into a rightward circular-polarized light 1006. Since the liquid crystal layer 1003 does not change the state of polarization, the rightward circular-polarized light 1006 passes through the quarter-wavelength plate 1002 and returns to the P-polarized light, wherein it passes through the polarization plate 1001 and radiates, wherein the white display is effected. As in the prior arts, since it is possible to change the retardation of the liquid crystal by changing the intensity of application voltage, display of intermediate colors can be brought about.

The point of the invention, which is remarkably different from the prior arts is in that light incident into the liquid crystal layer 1003 is circular-polarized light without fail. That is, as shown in FIG. 2B, since the light that is reflected by the reflection layer 1010 and is incident into the liquid crystal layer 1003 is circular-polarized light, the intensity of the light radiating from the liquid crystal layer 1003 is not influenced by the direction of orientation (hereinafter called an "azimuth direction") of liquid crystal in a plane in the direction parallel to the substrate surface. Therefore, the invention can bring about an excellent effect, by which a brightly white display is enabled, regardless of the liquid crystal being oriented in any azimuth direction. Resultantly, in the TN or STN mode, an excellent advantage can be brought about, by which even if the rubbing direction slips in the process of production, this does not influence at all. Still further, in a mode that does not require rubbing as in a perpendicularly oriented mode or amorphous TN mode, there is no case where a blackening portion is produced in a white display as in the prior arts. Therefore, a remarkably bright display is enabled in comparison with the prior arts, wherein there is a remarkably large advantage in that it is possible to produce a bright reflection liquid crystal display by simplified processes. That is, since it is enough that the liquid crystal layer 1003 has a feature of varying the retardation by $\lambda/2$ (phase difference $\pi$) regardless of the orientation of the azimuth angle, in high speed modes other than the above, the reflection liquid crystal display can be used without requiring accurate control of the rubbing direction.

Another advantage of the invention resides in that a scattering film or macromolecular dispersion liquid crystal layer, etc., is disposed instead of a scattering layer, and it is possible to easily change over a wide field-of-view angle and a narrow field-of-view angle or vice versa by attaching or detaching the scattering film or switching the macromolecular dispersion liquid crystal layer. In particular, since the color filtering layer consisting of a cholesteric material layer is provided at the side where the liquid crystal layer of the first substrate exists, a so-called parallax problem does not occur. In addition to this feature, by provision of the scattering film or macromolecular dispersion liquid crystal layer, it becomes easy to control the field-of-view angle. Especially, in the case where an attempt is made to obtain a wide field-of-view angle by utilizing the light scattering property of the scattering film or macromolecular dispersion liquid crystal layer, a problem of parallax occurs unless light that is incident into the film is not collimated well. However, in the invention, since the color filtering layer consisting of a cholesteric material layer is provided on the liquid crystal layer of the first substrate, and the direction of selection reflection of the cholesteric liquid crystal is limited to a specified direction, only light that is automatically collimated is permitted to be reflected on the scattering layer. Therefore, the problem of parallax does not occur, and a wide field-of-view angle can be obtained. In the case where an attempt is made to obtain a narrow field-of-view angle, the scattering property may be removed or the angle of the scattering may be adjusted so as to be decreased. Thus, in the case where only a reflection plate of a cholesteric material layer is used, which does not use any scattering film, a narrow field-of-view angle that is limited to only the direction of selection reflection can be widened to a field-of-view angle which is sufficient in practice, by using the scattering film or a macromolecular dispersion liquid crystal layer.

Also, since, in the liquid crystal layer of a reflection liquid crystal display, a feature of widening the field-of-view angle is achieved by a film having a scattering property, an especially wide field-of-view angle is not required in the mode of liquid crystal. Therefore, the range of selecting a liquid crystal mode can be widened. That is, the liquid crystal mode may be freely chosen from bright modes of high-speed response and be used. In particular, in the case of a perpendicularly oriented mode, since the mode can be made bright regardless of the shift-down direction, as far as liquid crystal molecules can be shifted down by application of voltage, in addition to that the mode has high contrast in principle, there is no need to control the rubbing and to carry out other orientation control, wherein there are other advantages in that the degree of freedom can be widened in designing of pixels, and the liquid crystal materials can be widely selected. In addition, even in the case where a so-called amorphous TN mode not requiring any rubbing, which is the TN mode instead of being perpendicularly oriented, is employed, there is a large advantage by virtue of the same reason as those in the above. Still further, in a mode in which liquid crystal is made erect by applying voltage in the direction perpendicular to liquid crystal (liquid crystal in which liquid crystal molecules are oriented in various directions in the azimuth direction) that is homogeneously oriented by using a horizontally oriented film without rubbing, there is a large advantage by virtue of the reason similar thereto.

Also, in the invention, the color filtering layer is disposed in liquid crystal cells on the first substrate. Therefore, in particular, in the case of a so-called active matrix drive, in which liquid crystal is driven by a switching element such as a thin-film transistor (TFT), since the switching element to drive the color filtering layer and another switching element to drive the liquid crystal can be formed on the same first substrate, no alignment is required between two upper and lower substrates. This is remarkably advantageous in view of production.

Further, although the substrates are generally made of glass substrates, plastic substrates may be used to lighten the total weight.

Also, the optical absorbing layer may be of any type, which is black, and may be concurrently made of a black matrix material. That is, a metal such as chrome, a film of a metal whose surface is roughed so as not to reflect light, or a black paint so called black resist, or resin including a pigment, etc., may be used.

In addition, in a liquid crystal display according to the invention, orientation and division are not necessarily required in the liquid crystal cells. However, the orientation and division may be carried out in the case where it is better to use oriented and divided liquid crystal cells in view of the field-of-view angle characteristics in the case where being used in a narrow field-of-view angle, in view of uniformity of brightness in the panel plane, and a response rate, etc.

In this case, where it is assumed that the electrode (pixel electrode) disposed on the surface of a liquid crystal layer at the first substrate side, that is, the surface at the rearward side in the incident direction of light is circular or equilaterally polygonal to have more sides than those of a triangle, and that the electrode (common electrode) disposed on the surface of a liquid crystal layer at the second substrate side, that is, the surface at the forward side in the incident direction of light is larger in area than that of the pixel electrode and is formed at a position where it can cover the entire pixel electrode, it is possible to easily orient and divide liquid crystal cells without increasing the processes of production. Also, it is preferable that said common electrode is formed on almost the entire surface of the second substrate. Further, it is preferable that, at the positions equidistant from each other in the circumference or at the corners of an equilateral polygon, the pixel electrode is shaped so that a cut is formed, a projection protruding outward is formed, or a recess is formed at a part of said pixel electrode, or so that it is formed of a combination thereof.

Still further, it becomes possible to further secure the initial orientation of liquid crystal by making a polymerizable monomer or oligomer, which is mixed in liquid crystal at a slight ratio, macromolecular after having controlled the initial orientation by applying voltage between the common electrode and pixel electrode. When controlling the initial orientation, the temperature may be lowered while applying voltage between the common electrode and pixel electrode after having made the liquid crystal layer isotropic by heating, and only voltage may be applied between the common electrode and pixel electrode at room temperature. Also, a monomer reaction may be brought about prior to heating the liquid crystal layer to make it isotropic, during heating the same or after having cooled it down. Even in the case of controlling the initial orientation by applying voltage between the common electrode and pixel electrode at room temperature, a macromolecular reaction may be brought about prior to the application of voltage, or may be brought about after the application thereof. At this time, since the orientation and division are enabled in the form of normal drive, it is not necessary to provide a process of applying voltage to the second electrode as in the prior art example 2.

In addition, a method for producing a reflection liquid crystal display according to the invention carries out control of a pre-tilt angle based on the division profile, using an optical orientation method in advance on substrates, whereby the control of the initial orientation can be made remarkably secure. Thereby, by virtue of a synergetic effect of an oblique electric field and a pre-tilt angle, the division orientation can be further remarkably effectively achieved than either of the processes. For example, a substance having a functional group by which orientation of liquid crystal can be controlled by polarization such as a cinnamic group, or a macromolecule in which a photosensitive group is polymerized by irradiation of polarized light as described in the AM-LCD 1996/IDW 1996 Digest of Technical Papers, Page 337 is used as an orientation film, and polarized light is irradiated from a diagonal direction via a mask at respective parts so that a pre-tilt angle is given in a direction along the division profile. In this case, since the number of times of operation for optical orientation is increased if the number of sides of a polygon is large, a polygon from an octagon to a triangle is preferable.

Such a method for division and orientation has been publicly known. However, in such a case, by making a polymerizable monomer or oligomer, which is mixed in liquid crystal at a slight ratio, macromolecular, it is possible to further securely maintain the division when driving.

As a monomer or oligomer used in the present invention, any one of an optically hardening monomer, thermally hardening monomer, and oligomer thereof may be used, and the monomer or oligomer may include other constituents as long as they include these. The optical hardening monomer or oligomer is not limited to those that not only react to visible light beams but may include those that react by an ultraviolet ray, wherein an ultraviolet ray hardening monomer is particularly preferable in view of ease in operation.

Also, a macromolecular compound used in the invention may be a compound having a structure that is similar to that of liquid crystal molecules including monomer and oligomer having liquid crystalinity. However, since the macromolecular compound is not necessarily used to orient liquid crystal, it may be a compound having flexibility, which has an alkylene chain. Also, it may be a compound belonging to a mono-functional group monomer, or may be a monomer having a multi-functional group such as a double-functional group or tri- or more functional group.

As optically- or ultraviolet ray-hardening monomers used in the invention, for example, mono-functional acrylate compounds may be used, which are 2-ethylhexyl acrylate, butylethyl acrylate, butoxyethyl acrylate, 2-cyanoethyl acrylate, benzyl acrylate, cyclohexyl acrylate, 2-hydroxy propyl acrylate, 2-ethoxyethyl acrylate, N,N-diethylaminoethyl acrylate, N,N-dimethylaminoethyl acrylate, dichlopentanyl acrylate, dichlopentanyl acrylate, glycizyl acrylate, tetrahydro furfuryl acrylate, isobonyl acrylate, isodecyl acrylate, lauryl acrylate, morpholine acrylate, phenoxyethyl acrylate, phenoxydiethlene glycol acrylate, 2,2,2-trifluoroehtyl acrylate, 2,2,3,3,3-pentafluoropropyl acrylate, 2,2,3,3-tetrafluoropropyl acrylate, and 2,2,3,4,4,4-hexafluorobutyl acrylate, etc.

Also, mono-functional methacrylate compounds may be used, which are 2-ethylhexyl methacrylate, butylethyl methacrylate, butoxyethyl methacrylate, 2-cyanoethylmethacrylate, benzyl methacrylate, cyclohexyl methacrylate, 2-hydroxypropyl methacrylate, 2-ethoxyethyl methacrylate, N,N-diethylaminotheyl methacrylate, N,N-diethylaminoethyl methacrylate, dicyclopentanyl methacrylate, dicyclopentanyl methacrylate, glycizyl methacrylate, tetrahydrofurfuryl methacrylate, isobonyl methacrylate, isodecyl methacrylate, lauryl methacrylate, morpholine methacrylate, phenoxyethyl methacrylate, phenoxydiethylene glycol methacrylate, 2,2,2-trifluoroethyl methacrylate, 2,2,3,3-tetrafluoropropyl methacrylate, 2,2,3, 3,3-pentafluoropropyl methacrylate, and 2,2,3,4,4,4-hexafluorobutyl methacrylate, etc.

Further, multi-functional acrylate compounds may be used, which are 4,4'-viphenyl diacrylate, diethylstyrbestrol diacrylate, 1,4-bisacryloyl oxybenzene, 4,4'-bisacryloyl oxydiphenylether, 4,4'-bisacryloyl oxydiphenyl methane, 3,9-bis[1,1-dimethyl-2-acryloyloxyethyl]-2,4,8,10-tetraspiro[5,5]undecane, α,α'-bis[4-acryloyl oxyphenyl]-1, 4-diisopropyl benzene, 1,4-bisacryloyl oxytetrafluorobenzene, 4,4'-bisacryloyl oxyoctafuloro biphenyl, diethelene glycol diacrylate, 1,4-butanedioldiacrylate, 1,3-buthylene glycol diacrylate, dicyclo pentanyl diacrylate, glycerol diacrylate, 1,6-hexanediol diacrylate, neopentyl glycol diacrylate, tetraethylene glycol diacrylate, trimethylol propane triacrylate, pentaerythritol tetraacrylate, pentaerythritol triacrylate, ditrumethylol propane tetraacrylate, dipentaerythritol hexaacrylate, dipentaerythritol monohydroxypentaacrylate, 4,4'-diacryloyl oxystilbene, 4,4'-diacryloyl oxydimethyl stilbene, 4,4'-diacryloyl oxydiethyl stilbene, 4,4'-diacryloyl oxydipropyl stilbene, 4,4'-diacryloyl oxydibutyl stilbene, 4,4'-diacryloyl oxydipentyl stilbene, 4,4'-diacryloyl oxydihexyl stilbene, 4,4'-diacryloyl oxydifluorostilbene, 2,2,3,3,4,4-hexafluoropentandiol-1, 5-diacrylate, 1,1,2,2,3,3-hexafluoropropyl-1, 3-diacrylate, and urethane acrylate oligomer, etc.

Still further, multi-functional methacrylate compounds such as diethylene glycol dimethacrylate, 1,4-butanediol dimethacrylate, 1,3-butylene glycol dimethacrylate, dicyclopentanyl dimethacrylate, glycerol dimethacrylate, 1,6-hexanediol dimethacrylate, neopentyl glycol dimethacrylate, tetraethylene glycol dimethacrylate, trimethylol propane trimethacrylate, pentaerythritol tetramethacrylate, pentaerythritol trimethacrylate, ditrimethylol propanetetra methacrylate, dipentaerythritol hexamethacrylate, dipentaerythritol monohydroxy pentamethacrylate, 2,2,3,3,4,4-hexafluoropenatdiol-1, 5-dimethacrylate, and urethane methacrylate oligomer, etc., other styrene, aminostyrene, and vinyl acetate, etc., may be available. But, the optically and ultraviolet-ray hardening monomers are not limited to the above.

Since the drive voltage of elements of the invention is influenced by a mutual action at the boundary phase between a macromolecular material and liquid crystal material, the monomer may be a macromolecular compound including a fluorine atom. As such a macromolecular compound, macromolecular compounds may be listed, which are synthesized with a compound including 2,2,3,3,4,4-hexaafluoropentanediol-1, 5-diacrylate, 1,1,2,2,3,3-hexafluoropropyl-1, 3-diacrylate, 2,2,2-trifluoroethyl acrylate, 2,2,3,3,3-penta fluoro propyl acrylate, 2,2,3,3-tetraafluoropropyl acrylate, 2,2,3,4,4,4-hexafluorobutyl acrylate, 2,2,2-trifluoroethylmethacrylate, 2,2,3,3-tetrafluoropropyl methacrylate, 2,2,3,4,4,4-hexafluorobutyl methacrylate, and urethane acrylate oligomer, etc., but the macromolecular compounds are not limited to these.

In the case where an optically hardening or ultraviolet-ray hardening monomer is used as a macromolecular compound used for the invention, an initiator for light or ultraviolet ray may be used. Various types of initiators may be used. For example, acetophenon-based initiators such as 2,2-diethoxy acetophenon, 2-hydroxy-2-methyl-1-phenyl-1-on, 1-(4-isopropylphenyl)-2-hydroxy-2-methylpropane-1-on, and 1-(4-dodecylphenyl)-2-hydroxy-2-methylpropane-1-on, etc., benzoin-based initiators such as benzoinmethylether, benzoinethylether, and benzyl dimethyl ketal, etc., benzophenon-based initiators such as benzophenon, benzoil benzoic acid, 4-phenyl benzophenon, and 3,3-dimethyl-4-methoxybenzophenon, etc., thioxanson-based initiators such as thioxanson, 2-chlorthiozanson, and 2-methylthioxanson, etc., diazonium salt-based initiators, sulfonium salt-based initiators, iodonium salt-based initiators, and selnium salt-based initiators, etc., may be used.

Further, as regards the division, there is no problem if a sufficient interval is secured between pixels. However, in a case where pixels approach each other particularly in order to secure a convenience in design, so-called dot-inverted drive in which the polarities of voltage applied onto adjacent pixels is carried out when driving the pixels, wherein since a state of occurrence of oblique electric fields is improved, better division can be obtained.

In addition, pixels can be reset to be returned to a black state in a frame and driven in order to improve the separation or cut of moving pictures. In normal cathode ray tubes (CRT), the display screen shines at high brightness for several milliseconds, and the display screen is kept black for the remaining time of one frame (16.6 milliseconds). Therefore, when displaying a moving picture, there is a time, at which nothing is seen, between a moving picture and another moving picture. To the contrary, in liquid crystal display, the screen is kept shinning for 16.6 milliseconds at the same brightness. Therefore, an overlapping portion can be sensitively seen between a moving picture and another moving picture when a picture moves. Therefore, at a glance, it seems that moving pictures are out of focus. At this time, if a black display is inserted at the end portion of the 16.6 milliseconds, the vagueness can be reduced, and the moving pictures can be smoothly seen. This means that separation or cut of moving pictures is improved.

Figure 3:
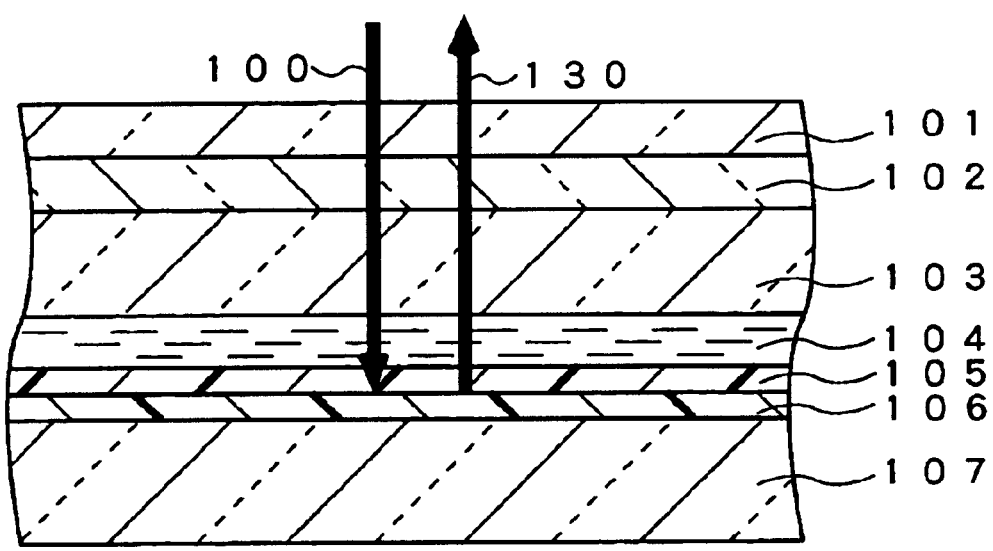
FIG. 3 is a sectional view showing a reflection liquid crystal display according to a first embodiment of the invention.

Hereinafter, a detailed description is given of embodiments of the invention with reference to the accompanying drawings. FIG. 3 is a sectional view showing a reflection liquid crystal display according to a first embodiment of the invention.

As shown in FIG. 3, an optical absorption plate 106 is disposed on a first substrate 107, and a reflection layer 105 besides acting as a color filter (color filtering layer), which consists of a cholesteric material layer and concurrently operates as a color filter and a reflection plate, is disposed on the optical absorption layer 106. A transparent substrate 103 acting as a second substrate is disposed on the reflection layer 105 besides acting as a color filter with a liquid crystal layer 104 placed therebetween. The transparent substrate 103 is disposed so as to be opposed to the first substrate 107, so that the transparent substrate 103 comes to the forward side of the first substrate 107 in the incident direction of light. And, a wide-band quarter-wavelength plate 102 is disposed on the surface at the forward side in the light-incident direction of the transparent substrate 103, and a polarization plate 101 is further disposed on the surface at the forward side in the light incident direction of the quarter-wavelength plate. The polarization plate 101 is disposed so that the direction of the transmission axis thereof is formed at 45 degrees with respect to the direction of the optical axis of the quarter-wavelength plate 102. Also, the liquid crystal layer 104 is formed so that the retardation, when appointed voltage is applied, varies by half a wavelength.

In principle, as described above, incident light 100 that has passed through the polarization plate 101 and wide-band quarter-wavelength plate 102 is converted to a circular-polarized light by the transmission axis of the polarization plate 101 and optical axis of the quarter-wavelength plate 102 being disposed so that they are inclined at 45 degrees. And, whether the optical axis is disposed so as to be inclined clockwise (rightward) to 45 degrees with respect to the transmission axis of the polarization plate 102 or counter-clockwise (leftward) to 45 degrees with respect thereto decide that the light which has passed through the polarization plate 101 and wide-band quarter-wavelength plate 102 becomes a rightward circular-polarized light or leftward circular-polarized light.

Figure 4:
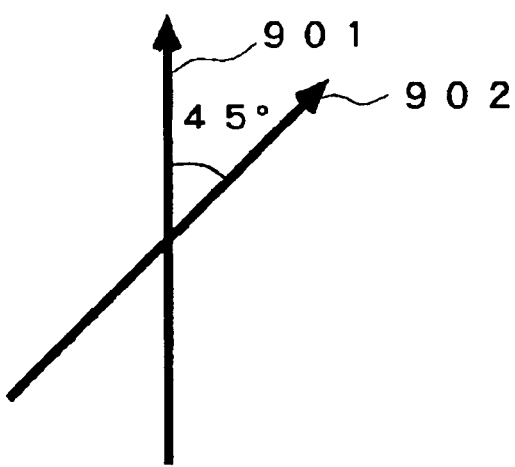
FIG. 4 is an exemplary view showing the direction of a transmission axis of a quarter-wavelength plate and direction of optical axis of a polarization plate where incident light becomes rightward circular-polarized light.

Hereinafter, a description is given of an action of the embodiment where the polarization plate 101 and quarter-wavelength plate 102 are established so as to make the light become, for example, rightward circular-polarized light. FIG. 4 is an exemplary view showing the transmission axis direction of the quarter-wavelength plate and the optical axis direction of the polarization plate in the case where the incident light becomes a rightward circular-polarized light. In the present embodiment, as shown in FIG. 4, the polarization plate 101 and wide-band quarter-wavelength wavelength plate 102 are disposed so that the optical axis direction 902 of the quarter-wavelength plate 102 is inclined clockwise to 45 degrees with respect to the transmission axis direction 901 of the polarization plate 101, and the reflection layer 105 besides acting as a color filter of the cholesteric material layer is made into a right-twisted cholesteric material layer.

Even in any mode, normally, the liquid crystal layer 104 brings about the same action as that of the half-wavelength plate by turning it on or off. That is, the phase difference is varied between 0 and $\pi$ in response to applied voltage. The incident light 100 becomes a rightward circular-polarized light by passing through the polarization plate 101 and wide-band quarter-wavelength plate 102. In this case, when the phase difference of the liquid crystal layer 104 is 0, the rightward circular-polarized light that has passed through the liquid crystal layer 104 enters the reflection layer 105 besides acting as a color filter consisting of a cholesteric material layer as it is a rightward circular-polarized light. Since the cholesteric material layer is right-twisted, light corresponding to a pitch of the cholesteric material layer is reflected and becomes a rightward circular-polarized light. Since the phase difference of the liquid crystal layer 104 is 0, the rightward circular-polarized light passes through the liquid crystal layer 104 as it is rightward circular-polarized light, and further enters the wide-band quarter-wavelength plate 102, wherein it is converted to a linear-polarized light that oscillates in the transmission axis direction of the polarization plate 101. Therefore, the linear-polarized light is able to pass through the polarization plate 101 and becomes an outgoing light 130. That is, with the pixel, a color corresponding to the pitch of the cholesteric material layer is displayed.

On the other hand, when the phase difference of the liquid crystal layer 104 is made into $\pi$ by applying voltage to the liquid crystal layer 104, the light that has passed through the quarter-wavelength plate 102 and has become rightward circular-polarized light is converted to leftward circular-polarized light by the liquid crystal layer 104. And, the leftward circular-polarized light enters the reflection layer 105 besides acting as a color filter consisting of a cholesteric material layer. Since the cholesteric material layer is right-twisted, the leftward circular-polarized light passes through the reflection layer 105 besides acting as a color filter. Therefore, it is absorbed by the optical absorption layer, wherein black is displayed with the pixel.

In the embodiment, bright and dark display of pixels can be controlled by varying the amount of reflection light by changing the retardation of the liquid crystal layer 104. In order to vary the amount of reflection light, there is a method for changing application voltage by using a threshold-free type ferroelectric liquid crystal or a method for making the retardation different in one liquid crystal cell by changing the electrode area, which is used to apply voltage to the liquid crystal layer in the liquid crystal cell. Thus, where the cholesteric material layer is used as a reflection layer 105 besides acting as a color filter, the reflection light has no dependency in relation to the azimuth angle direction since the reflection light is a circular-polarized light when pixels are bright. Therefore, even if liquid crystal is oriented in any form, a bright display similar to the above can be secured at all times. That is, it is not necessary to control the direction of orientation in the plane of a direction parallel to the substrate of a liquid crystal. Therefore, in the horizontal orientation mode, it does not become necessary to regulate the initial orientation by rubbing. Also, even in the perpendicular orientation mode, it does not become necessary to control the direction along which liquid crystal molecules are shifted down, wherein a reflection liquid crystal display for which production is facilitated can be proposed. Further, since the reflection layer 105 besides acting as a color filter in which a cholesteric material layer is used does not absorb any light, there is no case where light is converted to heat even if the intensity of irradiation light 100 is increased, and members deteriorate. Also, since the layer 105 does not absorb any light, a bright reflection liquid crystal display can be obtained.

In addition, although glass substrates are usually used for the transparent substrate 103 and the first substrate 107, plastic substrates may be used in view of weight, flexibility, etc. Where a transparent substrate is used as the first substrate 107, the optical absorption layer 106 may be provided at the side opposed to the side at which the liquid crystal layer 104 of the first substrate 107 is placed. Also, as in the present embodiment, where the optical absorption layer 106 is formed inside the liquid crystal cell on the first substrate 107, a non-transparent thin plate such as a stainless steel foil may be used as the first substrate 107. Further, in the embodiment, although the polarization plate 101 and a wide-band quarter-wavelength plate 102 are disposed outside the liquid crystal cells, that is, on the surface at the forward side in the light-incident direction of the transparent substrate 103, it may be placed between the transparent substrate 103 and the liquid crystal layer 104 thereon. Still further, the transparent substrate 103 may be disposed between the polarization plate 101 and the quarter-wavelength plate 102.

Also, the invention is featured in that a reflection layer 105 besides acting as a color filter is disposed at the side where the liquid crystal layer 104 of the first substrate 107 exists. That is, the reflection layer 105 besides acting as a color filter is formed on the first substrate 107 in the liquid crystal cells. Normally, wiring (not illustrated) by which liquid crystal of respective pixels is driven is formed around the respective liquid crystal pixels. It is necessary to accurately align the pixels of the respective pixels with the color elements, and necessary to adhere them altogether. However, in the invention, since the reflection layer 105 besides acting as a color filter is disposed on the first substrate 107 in a liquid crystal cell, the alignment can be made easier, wherein the ratio of opening is excellent, and it is possible to provide a reflection liquid crystal display whose production is facilitated. Besides, since there is no element, for which alignment is required, in the transparent substrate 103 acting as the second substrate at the side opposed thereto, alignment is no longer required for both the first substrate 107 and transparent substrate 103, wherein the production thereof can be much easier in comparison with a normal reflection liquid crystal display in which a reflection layer besides acting as a color filter is disposed at the transparent substrate side.

Figure 5:
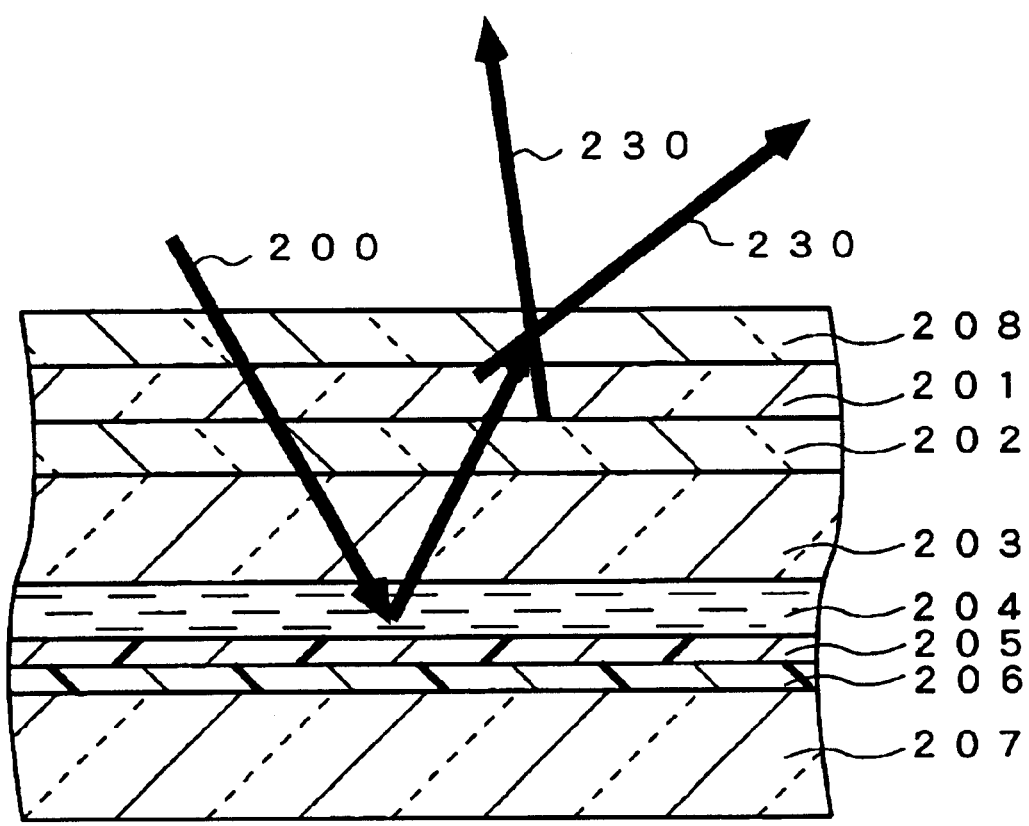
FIG. 5 is a sectional view showing a reflection liquid crystal display according to a second embodiment of the invention.

Next, a description is given of a second embodiment of the invention. FIG. 5 is a sectional view showing a reflection liquid crystal display according to the second embodiment of the invention. The embodiment is such that a film having a scattering property is further disposed on the display surface of a reflection liquid crystal display according to the first embodiment. As described with respect to the first embodiment, a transparent substrate 203 acting as a second substrate is opposed to a first substrate 207 with a liquid crystal layer 204 placed therebetween, and the transparent substrate 203 is disposed further forward in the incident direction of light from the first substrate 207. An optical absorption layer 206 is disposed on the surface at the forward side in the light-incident direction of the first substrate 207, that is in the liquid crystal cells. Further, a reflection layer 205 besides acting as a color filter that consists of a cholesteric material layer is disposed on the surface at the forward side in the light-incident direction of the optical absorption layer 206. In addition, a wide-band quarter-wavelength plate 202, on which a polarization plate 201 is disposed, is disposed on the surface at the forward side in the light-incident direction of the transparent substrate 203, that is, outside the liquid crystal cells. And, in the present embodiment, a scattering film 208 is disposed on the polarization plate 201.

As in the first embodiment, the present embodiment has advantages by which bright display can be brought about, and production can be facilitated. Further, although, in the first embodiment, there is a case where the field-of-view angle is not sufficient according to a certain purpose since the directivity of selection reflection of the cholesteric material layer is intensive, it is possible to easily secure a wide field-of-view angle in the embodiment since the scattering film 208 is provided. And, by attaching and detaching the scattering film, it is possible to easily change over a wide field-of-view angle and a narrow field-of-view angle or vice versa.

Next, a further detailed description is given of effects that are brought about by disposing a scattering film in the embodiment. Also, in the embodiment, a point in which the amount of reflection light is controlled by voltage applied onto the liquid crystal layer 204 is completely the same as that of the first embodiment. Incident light 200 that enters the polarization plate 201 and outgoing light 230 radiating from the polarization plate 201 are caused to scatter in response to the scattering properties of the scattering film 208.

An attempt to secure a wide field-of-view angle can be carried out by adjusting the scattering angle. It is possible to design a scattering film 208 that permits only light incident from an appointed angle to be transmitted and transmits only positive reflection constituents. Such a scattering film 208 may be formed by a method for optical polymerization from an oblique direction. If the scattering film 208 is designed so that the light that has entered at an angle of the positive reflection constituent and the pitch of the cholesteric liquid crystal meet Bragg's reflection conditions corresponding to the three prime colors, the respective colors can be displayed. At this time, it is common that different colors are juxtaposed in different pixels. Also, since the reflection light has passed through the scattering film 208, it is adequately scattered, and so-called paper white free from any glittering can be achieved. Further, when forming a scattering film

208, it is possible to adjust the field-of-view angle by adjusting the directivity of the direction corresponding to the reflection light. As a result, a plurality of scattering films 208 whose directivity in the reflection direction differs are prepared, wherein, by only re-attaching these, it is possible to easily change the field-of-view angle.

Conventionally, where an attempt is made to widen the field-of-view angle of a reflection liquid crystal display by using the scattering film, in the case of a transmission type, influence of adjacent pixels cannot be removed, wherein there was a problem of parallax in which letters are seen to be doubled. However, in the embodiment, for the two reasons which are a reflection layer 205 besides acting as a color filter consisting of a cholesteric material layer being close to the liquid crystal layer 204 and the directivity of selection reflection of the cholesteric material layer being high, there is an advantage in that no problem of parallax occurs in practice even if the field-of-view angle is widened.

Figure 6A:
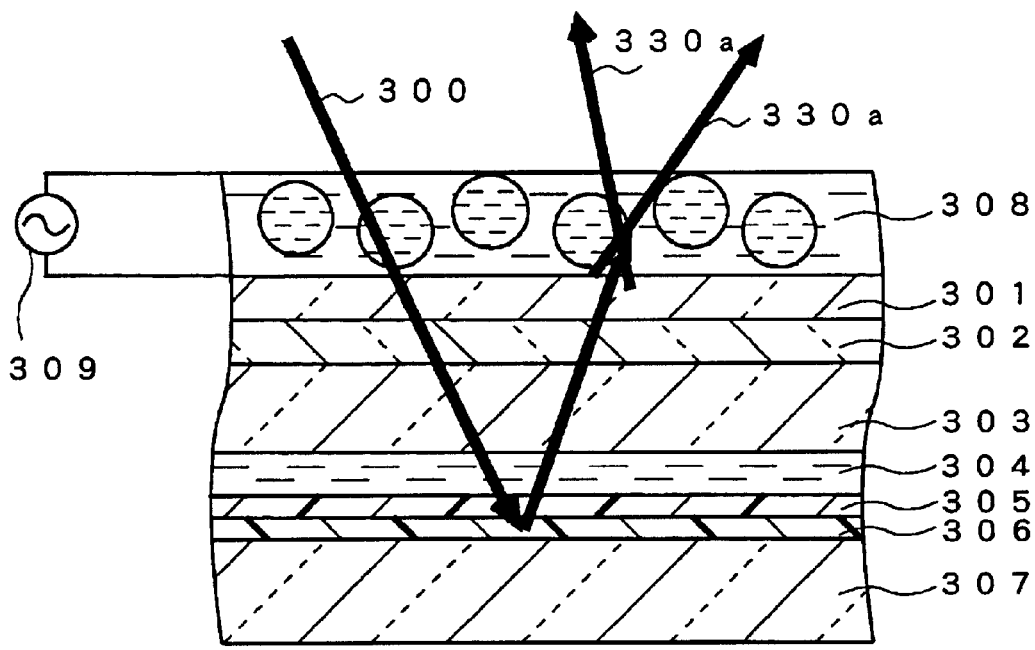
Figure 6B:
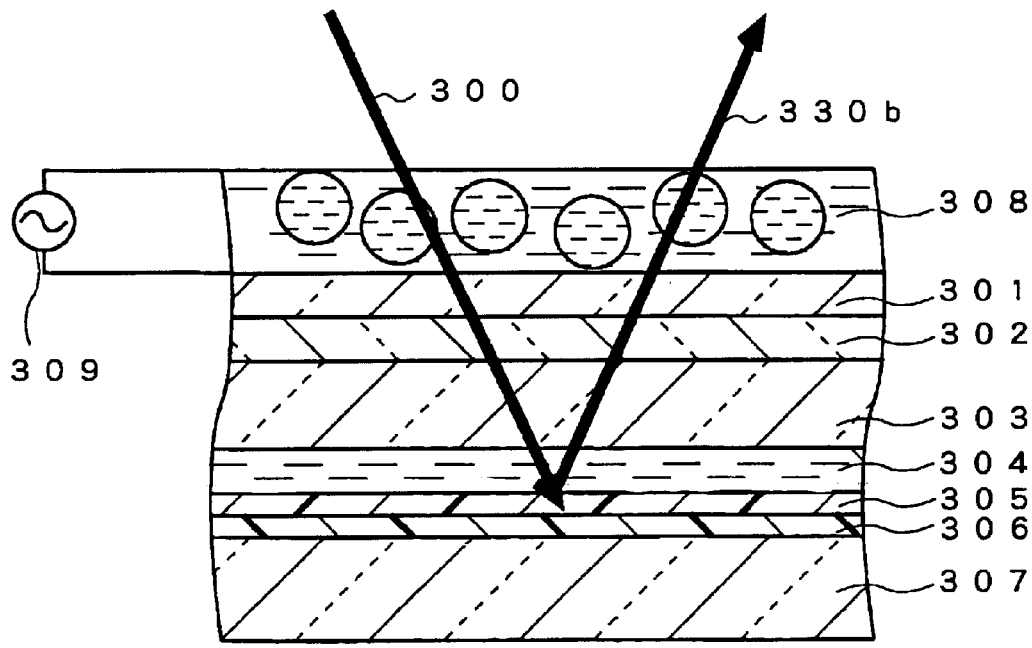

Next, a description is given of a third embodiment of the invention. The embodiment is such that a macromolecular dispersion liquid crystal layer is used instead of a scattering film 208 in the second embodiment. FIG. 6A and FIG. 6B are sectional views showing a reflection liquid crystal display according to the third embodiment of the invention, wherein FIG. 6A shows a state where no voltage is applied onto a macromolecular dispersion liquid crystal layer, and FIG. 6B shows a state where voltage is applied onto a macromolecular dispersion liquid crystal layer. As shown in FIG. 6A and FIG. 6B, a transparent substrate 303, which is disposed as a second substrate, is opposed to a first substrate 307 with a liquid crystal layer 304 placed therebetween. The transparent substrate 303 is disposed so that it comes forward to the first substrate 307 in the light-incident direction. And, an optical absorption layer 306 is formed on the surface at the forward side in the light-incident direction of the first substrate 307, and a reflection layer 305 besides acting as a color filter consisting of a cholesteric material layer is disposed on the surface at the forward side of the optical absorption layer 306 in the light-incident direction. Also, a wide-band quarter-wavelength plate 302 is disposed on the surface at the forward side of the light-incident direction of the transparent substrate 303 while a polarization plate 301 is disposed on the surface at the forward side of the light-incident direction of the quarter-wavelength plate 302. And, in the embodiment, a macromolecular dispersion liquid crystal layer 308 is disposed on the surface at the forward side of the light-incident direction of the polarization plate 301. A power source 309 is connected to the macromolecular dispersion liquid crystal layer 308, thereby controlling voltage that is applied onto the macromolecular dispersion liquid crystal 308.

Where incident light 300 is reflected by a reflection layer 305 besides acting as a color filter based on the principle similar to that of the first embodiment, it becomes light radiating from the macromolecular dispersion liquid crystal layer 308. The macromolecular dispersion liquid crystal layer 308 is such that liquid crystal drops are dispersed in a macromolecular medium. Usually, when no voltage is applied thereto, the outgoing light 330a is scattered, as shown in FIG. 6A, because the refractive index of the macromolecules in the medium is not coincident with the mean refractive index of liquid crystal. On the other hand, if voltage is applied thereto, the orientations of liquid crystal in the liquid crystal drops are lined up, wherein the refractive index of the macromolecular medium becomes almost the same as that of the liquid crystal to bring about a transparent state.

For example, if the pitch of the reflection layer 305 besides acting as a color filter consisting of a cholesteric material layer is formed so that it can meet Bragg's reflection conditions at an appointed wavelength with respect to the incident light 300 from an appointed angle, reflection light of an appointed color is reflected into the direction of selection reflection where the state is transparent due to application of voltage onto the macromolecular dispersion liquid crystal layer 308, it can pass through the macromolecular dispersion liquid crystal layer 308 and becomes outgoing light 330b. In addition, the reflection layer besides acting as a color filter has a high directivity. Due to these reasons, a narrow field-of-view angle can be obtained. On the other hand, in a state where no voltage is applied, as shown in FIG. 6A, the outgoing light 330a is scattered, and a wide field-of-view angle can be obtained in response to a degree of the scattering. Thus, it is possible to electrically change over a wide field-of-view angle and a narrow field-of-view angle.

As a method for forming a macromolecular dispersion liquid crystal layer 308, a mixture of photosensitive monomer and liquid crystal is poured between the transparent substrate (not illustrated) in which a transparent electrode such as ITO is formed, and the macromolecular dispersion liquid crystal 308, whereby, by irradiating an ultraviolet ray, the monomer is polymerized, resulting in phase separation. Also, the macromolecular dispersion liquid crystal layer may be used in a state where it is placed in the transparent substrate, and since the polymerized macromolecular dispersion liquid crystal layer becomes a considerably firm film, another macromolecular dispersion liquid crystal layer film is prepared, wherein a transparent electrode may be formed on both sides thereof. Further, not only a glass substrate but also a plastic substrate may be used as a transparent substrate.

When forming a macromolecular dispersion liquid crystal layer 308, light polymerization is not carried out by uniform light but by interference light, wherein it is possible to control a place where macromolecules are polymerized, and it is possible to set the scattering direction of light by utilizing the above.

Further, a scattering film similar to that of the second embodiment may be disposed on the macromolecular dispersion liquid crystal layer 308. For example, by designing so that light transmits at only the incident angle and angle of positive reflection constituents corresponding to the incident angle, a film for which the scattering property is suppressed is formed, and the film is provided on the macromolecular dispersion liquid crystal layer 308. And, the macromolecular dispersion liquid crystal layer 308 gives only a feature of carrying out changeover of whether or not the scattering property is provided. Thus, display in which color separation is more satisfactory can be obtained in the case where the scattering film and macromolecular dispersion liquid crystal layer 308 are concurrently used than in the case where only the macromolecular dispersion liquid crystal layer 308 is used.

Figure 7:
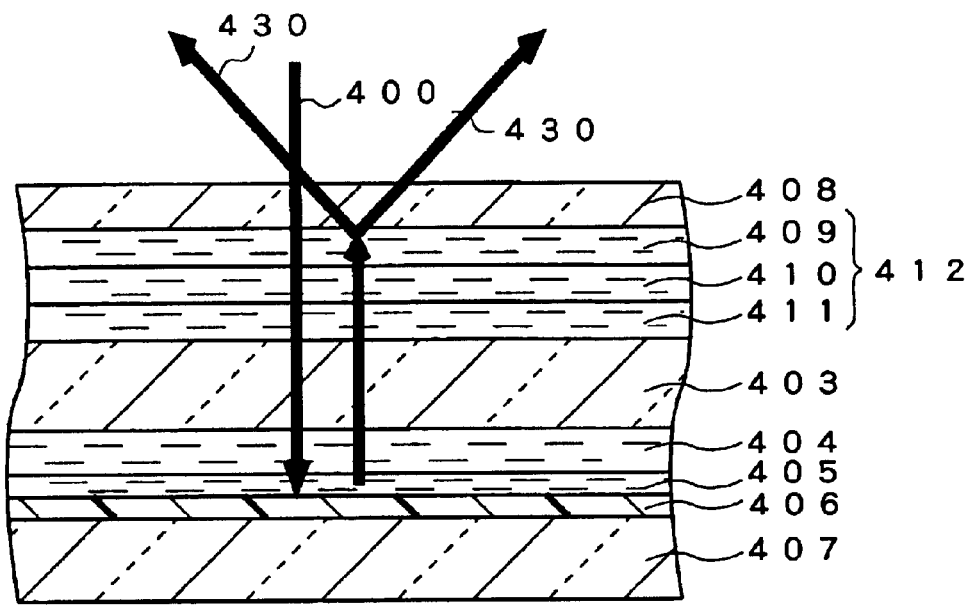
FIG. 7 is a sectional view showing a liquid crystal element according to a fourth embodiment of the invention.

Next, a description is given of a fourth embodiment according to the invention. FIG. 7 is a sectional view showing a liquid crystal display element according to the fourth embodiment of the invention. In the embodiment, a cholesteric material layer having an inverted twist of the cholesteric material layer, which is used in the reflection layer besides acting as a color filter, is laminated so as to correspond to the three prime colors instead of the polarization plate and wide-band quarter-wavelength plate in the first embodiment through the third embodiment.

That is, as shown in FIG. 7, a liquid crystal layer 404 is disposed between the first substrate 407 and a transparent substrate 403, corresponding to the first substrate 407, which is provided as a second substrate so as to come to the forward side of the incident direction of light. An optical absorbing layer 406 is disposed on the first substrate 407 in the liquid crystal cell, and a cholesteric material layer 405 that is a reflection layer besides acting as a color filter is disposed on the surface at the forward side of the incident direction of light of the optical absorbing layer 406. And, cholesteric material layers 409, 410 and 411, which have an inverted twist of that of the cholesteric material layer 405, are disposed on the transparent substrate 403 outside the liquid crystal cell. These cholesteric material layers 409, 410, and 411 are made into a three-layered laminated body corresponding to the three prime colors, and are installed at the side opposite to the side on which the liquid crystal layer 404 is placed on the transparent substrate 403. The twisting direction of the cholesteric material layers 409, 410 and 411 of the three prime colors, which are disposed outside the liquid crystal cell, is reverse of that of the cholesteric material layer 405 inside the liquid crystal cell. In addition, the up and down relationship between color layers in view of structure does not regard the capacity.

The color of the cholesteric material layer is determined by the pitch of twist of the cholesteric material layer. Therefore, in the cholesteric material layers 409, 410 and 411, the pitches of respective twist correspond to red (R), green (G), and blue (B). At this time, the pitches may gradually change and may be formed so as to correspond to the wavelength of the entire visible area. Since these layers do not need to change colors position by position, these layers may be formed as a single film, for example, by the material and method, which are described in R. Mauer, D. Andrejewski, F-H. Kreuzer, A. Miller, SID90DIGEST, pages 110 to 112 (1990), and may be adhered on the transparent substrate 403. Also, a color filtering layer consisting of a cholesteric material layer 405 may be formed of a liquid crystal layer, having a photosensitive group as described in Liquid Crystals, Vol. No.18, page 319 (1995), in which the chiral pitch is adjusted to an appointed color.

The cholesteric material layer 405 inside the liquid crystal cell may be formed of the material and method, which are described in R. Mauer, D. Andrejewski, F-H. Kreuzer, A. Miller, SID90DIGEST, Pages 110 to 112 (1990), as in the cholesteric material layers 409, 410, and 411 outside the liquid crystal cell. Also, since it is necessary for different color layers to be formed pixel by pixel in the cholesteric material layer 405, it is possible to produce the layer 405 by using the same lithography as that for forming a normal absorption type color filter. At this time, since the material itself that becomes the cholesteric material layer 405 is photosensitive, the lithography is comparatively easy.

It is possible to adequately select the pitch and twisting direction of the cholesteric material layer 405 in compliance with the quantity of a chiral agent to be mixed and its type. If an orientation film by which horizontal orientation is achieved is coated on the optical absorption layer 406, it is possible to form a cholesteric material layer 405 by which the twisting axis becomes perpendicular to the substrate. As necessary, such a method may be employed, by which an optical orientation film to rub the orientation film is formed, and the orientation of the cholesteric liquid crystal is controlled on the boundary phase by irradiation of polarized light.

Also, it is necessary to coat a liquid crystal orientation film on the cholesteric material layer in order to control the orientation of liquid crystal in the liquid crystal layer 404. At this time, it is highly recommended that burning of the orientation film is carried out at a low temperature of 180° C. or so, so that the state of liquid crystal orientation of the cholesteric material layer 405 is not disturbed. Also, it is recommended that no rubbing be performed due to similar reasons. Although rubbing may be performed when it is necessary to control the orientation of liquid crystal, it is preferable that the orientation is controlled by irradiation of polarized light by using an optical orientation film.

Next, a description is given of actions of the embodiment. For example, where it is assumed that the cholesteric material layer 405 inside the liquid crystal cell is right-twisted as in the first embodiment, all the cholesteric material layers 409, 410 and 411 of the three prime colors are left-twisted. When incident light passes through the three prime color laminated cholesteric material layers 409, 410 and 4110 from the exterior, leftward circular-polarized light of the light of wavelengths corresponding to the three prime colors R, G and B is reflected by the cholesteric material layer, and only the rightward circular-polarized light of the three prime colors is permitted to enter the liquid crystal layer 404. And, by the principle similar to that of the first embodiment, when the phase difference of the liquid crystal layer 404 is 0, the rightward circular-polarized light enters the reflection layer besides acting as a color filter consisting of a cholesteric material layer 405 as it is, and only light of the color corresponding to the pitch of the cholesteric material layer 405 is reflected as rightward circular-polarized light. Also, the other light passes through the cholesteric material layer 405 and is absorbed by the optical absorption layer 406. After that, the rightward circular-polarized light, which is the reflection light from the cholesteric material layer 405, passes through a liquid crystal layer 404 without being subjected to any change since the phase difference of the liquid crystal layer 404 is 0, and enters the cholesteric material layers 409, 410 and 411, which are laminated in three prime colors, as it is the rightward circular-polarized light. Since the cholesteric material layers 409, 410 and 411 are left-twisted, the rightward circular-polarized light passes through as it is, and is caused to radiate from the scattering film 408, thereby becoming outgoing light 430. The outgoing light 430 is scattered by the scattering film 408, is spread to an adequate angle and reaches the observer's eyes. Thus, a color corresponding to the pitch of the cholesteric material layer 405 is displayed at the pixel. On the other hand, by the principle similar to that of the first embodiment, where the phase difference of liquid crystal is π, the light from the liquid crystal layer 404 becomes leftward circular-polarized light. It passes through the cholesteric material layer 405 and is absorbed by the optical absorption layer 406, whereby black is displayed at the pixel.

As in the first embodiment through the third embodiment, in the fourth embodiment, the amount of reflection light can be controlled by varying the retardation of the liquid crystal layer 404. Also, since the reflection light is circular-polarized light without fail when being in a bright state, the reflection light has no dependency on the azimuth angle direction, and a bright display can be brought about even if the liquid crystal is oriented in any azimuth angle direction, which are completely the same as those in the first embodiment through the third embodiment. Further, since the scope of an incidence angle that meets Bragg's conditions is narrow in the case of selection reflection in which the cholesteric material layer 405 is used, the embodiment is featured in that the directivity of incident light and reflection is excellent. Still further, since it is possible to control the direction, which meets Bragg's conditions, by the size of pitch, it is advantageous in that it is easier to control the directivity in comparison with the case where a wide-band quarter-wavelength plate is used.

Figure 8:
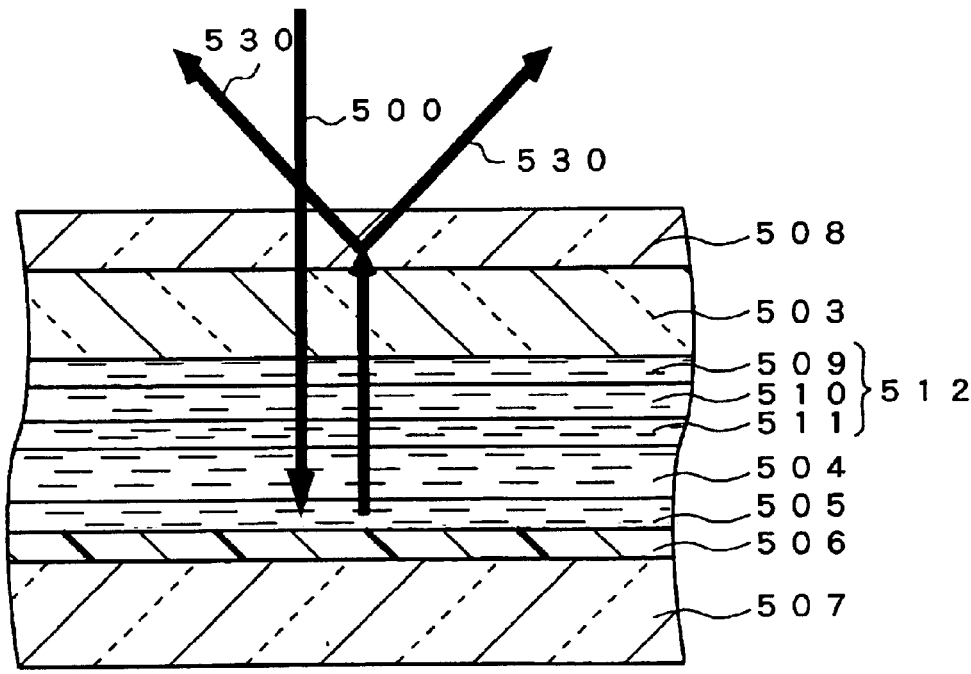
FIG. 8 is a sectional view showing a reflection liquid crystal display according to a fifth embodiment of the invention.

Next, a description is given of a fifth embodiment according to the invention. FIG. 8 is a sectional view showing a reflection liquid crystal display according to the fifth embodiment of the invention. In the fourth embodiment, cholesteric material layers, which has an inverted twist of the cholesteric material layer that is used for a reflection layer besides acting as a color filter, is laminated so as to correspond to the three prime colors outside of the liquid crystal cell. However, as shown in FIG. 8, in the fifth embodiment, the three prime-color laminated body is disposed inside the liquid crystal cell, that is, the surface at the rearward side in the incident direction of light in the transparent substrate 503 acting as the second substrate. All the other construction is the same as that of the fourth embodiment.

In the embodiment, a body 512, laminated in three prime colors, of cholesteric material layers 509, 510 and 511 having an inverted twist of that of the cholesteric material layer 505 used in a reflection layer besides acting as a color filter is disposed on the surface, at a liquid crystal layer 504 side, of a transparent substrate 503 which is disposed as the second substrate. The principle of display and production method are the same as those of the fourth embodiment. However, the laminated body 512 in which cholesteric material layers 509, 510 and 511 for converting natural light to rightward circular-polarized light (or leftward circular-polarized light) are laminated so as to correspond to the three prime colors is opposed to a cholesteric material layer 505 used for a reflection layer besides acting as a color filter with a liquid crystal layer whose thickness is several micrometers ($\mu$m) placed therebetween. Therefore, the embodiment is remarkably advantageous in view of parallax.

Figure 9A:
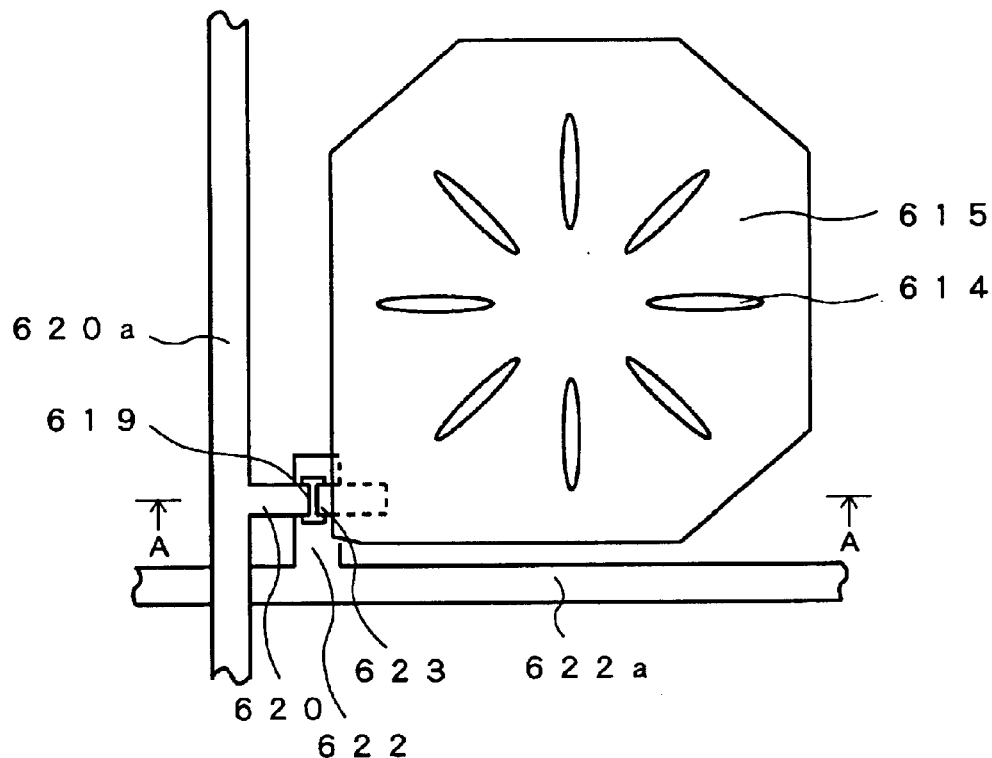
FIG. 9A is a plan view showing a reflection liquid crystal display according to a sixth embodiment of the invention.
Figure 9B:
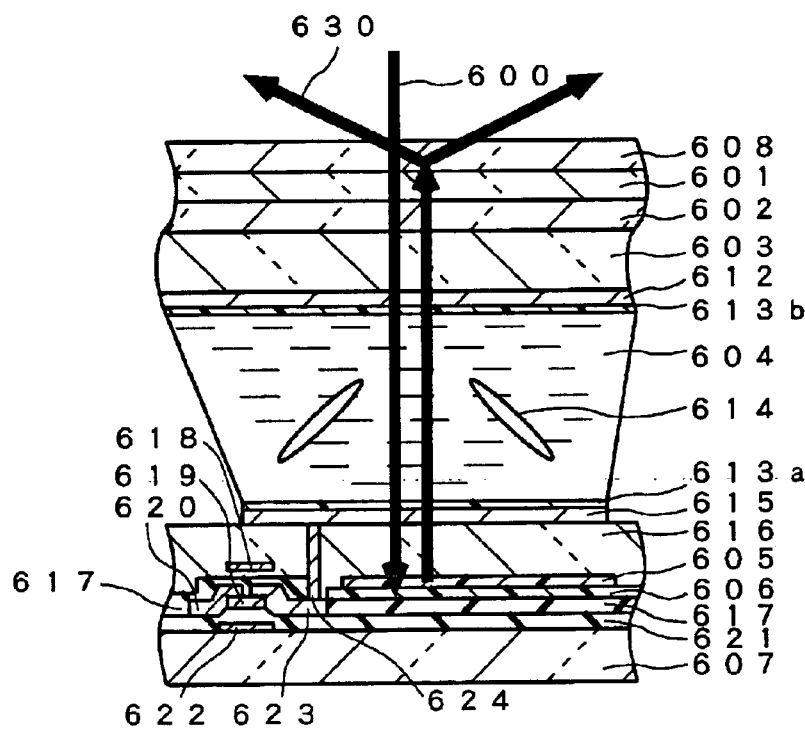
FIG. 9B is a cross-sectional view taken along the line A—A in FIG. 9A.

Next, a description is given of a sixth embodiment according to the invention. FIG. 9A is a plan view showing a reflection liquid crystal display according to the sixth embodiment of the invention, FIG. 9B is a sectional view taken along the line A—A of FIG. 9A. FIG. 9A and 9B shows a detailed structure in the case where liquid crystal is driven by an active element.

As shown in FIG. 9A, a picture signal line 620$a$ that is a data line is formed on a first substrate 607, and a drain electrode 620$b$ is connected thereto. That is, the drain electrode 620 is formed by partial extension of the picture signal line 620$a$. Also, a scanning signal line 622$a$ is formed so as to cross the picture signal line 620$a$, and a gate electrode 622 is connected thereto. That is, the gate electrode 622 is formed by partial extension of the scanning signal line 622$a$, and the picture signal line 620$a$ and scanning signal line 622$a$ are disposed in the form of a matrix.

Also, as shown in FIG. 9B, the gate electrode (scanning signal electrode) 622 made of a metal such as, for example, Cr or Al, is formed on a first substrate 607, and a gate insulation film 621 made of, for example, silicon nitride, etc., is formed so as to cover the gate electrode 622. A semiconductor film 619 made of, for example, non-crystalline silicon, etc., is formed on the gate electrode 622 via the gate insulation film 621. The semiconductor film 619 functions as a positive layer of a thin-film transistor (TFT). A drain electrode 620 and a source electrode 623, which are made of a metal, for example, molybdenum, etc., are formed so as to overlap a part of a pattern of the semiconductor 619. The drain electrode 620 and source electrode 623 are formed via a non-crystalline silicon film (not illustrated) into which, for example, an n-type impurity is doped, so that a part thereof overlaps the semiconductor 619. Furthermore, a protection layer 617 made of, for example, silicon nitride, is formed so that it covers the entirety of these electrodes and the gate insulation film 621. A light shielding film 618 is selectively formed on the protection layer 617 so that it covers the semiconductor film 619, which is a positive layer of the TFT. Also, an optical absorption layer 606 is formed on the protection layer 617, and a reflection layer 605 besides acting as a color filter consisting of a cholesteric material layer is further formed on the protection layer 617. And, the reflection layer 605 besides acting as a color filter consisting of the cholesteric material layer, optical absorption layer 606, and light shielding layer 618 are covered by an overcoating layer 616. The overcoating layer 616 is formed of a transparent insulation material that is hardly charged up. A pixel electrode 615 is formed on the overcoating layer 616, wherein a liquid crystal orientation film 613$a$ is coated thereon. The pixel electrode 615 is connected to the source electrode 623 via a throughhole 624.

Further, a transparent substrate 603 is opposed to the first substrate 607 with the liquid crystal layer 604 placed therebetween, and the transparent substrate 603 is disposed so that it comes forward to the first substrate 607 in the incident direction of light. A common electrode 612 is formed on the surface of the liquid crystal layer 604 side of the transparent substrate 603, and an orientation film 613$b$ is coated on the liquid crystal layer 604 side as in the pixel electrode 615. Also, a wide-band quarter-wavelength plate 602, polarization plate 601, and scattering film 608 are formed one after another on the surface at the forward side in the light-incident direction of the transparent substrate 603, that is, outside the liquid crystal cell, as in the second embodiment.

Orientation films 613$a$ and 613$b$ that are, respectively, coated on the pixel electrode 615 and common electrode 612 may be an adequate combination of a horizontal orientation film and a perpendicular orientation film on the basis of a liquid crystal mode that is used. Although the liquid crystal mode that is used may be in any form, a mode that does not require rubbing, such as a perpendicular orientation mode and amorphous TN mode, is preferable in view of shortening the production process.

Hereinafter, a description is given of actions of the embodiment, wherein the case of using the perpendicular orientation mode is taken as an example. Also, as in the first embodiment, it is assumed that the reflection layer 605 besides acting as a color filter consisting of a cholesteric material layer is right-twisted, and the polarization plate 601 and wide-band quarter-wavelength plate 602 are disposed, as shown in FIG. 4, so that the optical axis direction 902 of the quarter-wavelength plate 602 is inclined clockwise by 45 degrees with respect to the transmission axis direction 901 of the polarization plate 601, wherein incident light becomes rightward circular-polarized light after having passed through the polarization plate 601 and quarter-wavelength plate 602. A perpendicular orientation film is coated on the pixel electrode 615 and common electrode 612. When no voltage is applied, the liquid crystal molecules 614 are oriented roughly perpendicular to the first substrate 607 and transparent substrate 603. The incident light 600 is made into rightward circular-polarized light by passing through the polarization plate 601 and wide-band quarter-wavelength plate 602, and enters the liquid crystal layer 604. At this time, since the retardation of the light crystal layer 604 is 0, the light is reflected by the reflection plate 605 besides acting as a color filter, and again passes through the liquid crystal layer 604, quarter-wavelength plate 602, and polarization plate 601, wherein the outgoing light 630 scattered by the scattering film 608 creates colors corresponding to the pitches of the reflection plate 605 besides acting as a color filter.

On the other hand, if voltage is applied to the gate electrode 622 to turn on a thin-film transistor (TFT), voltage is applied to the source electrode 623, and an electric field is induced between the pixel electrode 615 and the common electrode 612 disposed so as to be opposed thereto. Liquid crystal molecules 614 whose dielectric anisotropy is negative is shifted down in a direction parallel to the substrate by the electric field. Thereby, since the retardation of the liquid crystal layer has a specified value, light passes through the reflection plate 605 besides acting as a color filter and is absorbed by the optical absorption plate 606. Then, the light becomes dark. When the retardation of the liquid crystal layer 604 varies by half a wavelength, all light that has passed through the liquid crystal layer 604 is converted to leftward circular-polarized light, and is absorbed by the optical absorption layer 606. Therefore, it becomes the darkest. If the retardation (dΔn) that is a product of the refractive index anisotropy Δn of liquid crystal molecules and thickness d of the liquid crystal layer is set to an adequate value, it is possible to control the display so that it becomes the brightest when no voltage is applied and the retardation of the liquid crystal layer is varied by half a wavelength when appointed voltage is applied, that is, the display becomes the darkest. Conventionally, brightness is sacrificed in order to secure a wide field-of-view angle in a prior art perpendicular orientation mode. However, in the embodiment, it is not necessary to sacrifice the brightness since a wide coverage is secured by a scattering film 608. Also, a bright display can be secured even when the drive voltage is slight. For example, if a liquid crystal cell of a perpendicular orientation mode having a remarkably large figure such as a retardation dΔn being 670 nm is formed, the retardation dΔn is varied by half a wavelength only where the polar angle of liquid crystal molecules slightly changes, the darkest display can be achieved. At this time, since it is enough to slightly change the polar angle of the liquid crystal molecules, the application voltage may be slight. However, in a prior art perpendicular orientation mode, if the dΔn is set to such a large value, the field-of-view angle characteristics are worsened. Therefore, the retardation is suppressed to dΔn=330 nm. Accordingly, it is necessary to significantly change the polar angle of liquid crystal molecules, whereby the drive voltage becomes large. Further, if a worsening of the field-of-view angle characteristics is taken into consideration, such drive cannot be carried out, by which the retardation of liquid crystal is completely changed by half a wavelength. Therefore, the brightness is sacrificed. In the present invention, since the field-of-view angle characteristics are not worsened even if the retardation (dΔn) of a liquid crystal layer is increased to any large value, low-voltage drive is enabled, and a bright display is enabled, too. In addition, since a change in the polar angle of liquid crystal molecules may be slight, it is possible to accelerate the response rate. At this time, although the retardation (dΔn) can be decreased even if either of the thickness d of liquid crystal cells or the refractive index anisotropy Δn of the liquid crystal molecules is small, it is preferable in view of high-speed response that the thickness d of liquid crystal cells is smaller.

Further, since the light that enters the liquid crystal layer is circular-polarized light as described above, the display is bright even if the liquid crystal molecules are shifted down in any direction, it is not necessary to accurately control the shift-down direction of liquid crystal molecules as in the prior art perpendicular orientation mode.

Still further, in a reflection liquid crystal display according to the invention, it is not especially necessary to provide the liquid crystal cell with orientation and division. However, in view of the field-of-view angle characteristics when being used in a narrow field-of-view angle, uniformity of the brightness in a display screen, and response rate, it is preferable that the division is smoothly carried out, depending on liquid crystal materials and elements. In such a case, the orientation and division may be carried out.

As regards the orientation and division, if, taking note of the size and shape of electrodes on the upper and lower substrates, an electrode on the first substrate 607 is shaped so as to have better symmetry, an electrode on the second substrate covers the entirety of the upper part of the electrode on the first substrate 607, and the electrode on the second substrate is wider than the electrode on the first substrate 607, no additional process in production is required, wherein the orientation and division can be smoothly carried out.

Also, by making the shape of the pixel electrode 615 better symmetrically and designing the common electrode 612 larger than the pixel electrode 615, an electric field that is produced between both the electrodes is not perpendicular to the substrates but is made into an oblique electric field facing from the surrounding of the pixel electrode 615 to the middle thereof. With this electric field, the liquid crystal molecules 614 whose dielectric anisotropy is negative are shifted down symmetrically to the middle of the pixel. Therefore, the orientation direction of the liquid crystal in the pixels is naturally divided. Thus, the shift-down direction of the liquid crystal molecules 614 can be automatically divided without additional processing of the orientation films 613a and 613b, wherein the movement of the liquid crystal is made smooth.

Further, in a case where the shift-down direction of the liquid crystal molecules 614 is completely controlled, an optical orientation film is used for the orientation films 613a and 613b, wherein such an operation may be carried out, in which polarized light or non-polarized light is irradiated obliquely in response to the characteristics of the optical orientation film. Also, in order to prevent the orientation of the liquid crystal from being disordered, a slight amount of monomer may be doped in liquid crystal, and the liquid crystal may be polymerized in order to memorize an adequate state of orientation.

In addition, in the case of the sixth embodiment, since the pixel electrode 615 is sufficiently apart from the gate line (scanning signal line) 622a and drain line (picture signal line) 620a in view of its structure, there is almost no case where the orientation of liquid crystal is disordered due to these electric fields. However, in order to prevent the orientation of liquid crystal from being adversely influenced by the peripheries, a shielding electrode may be provided at either one or both of the electrodes.

Figure 10A:
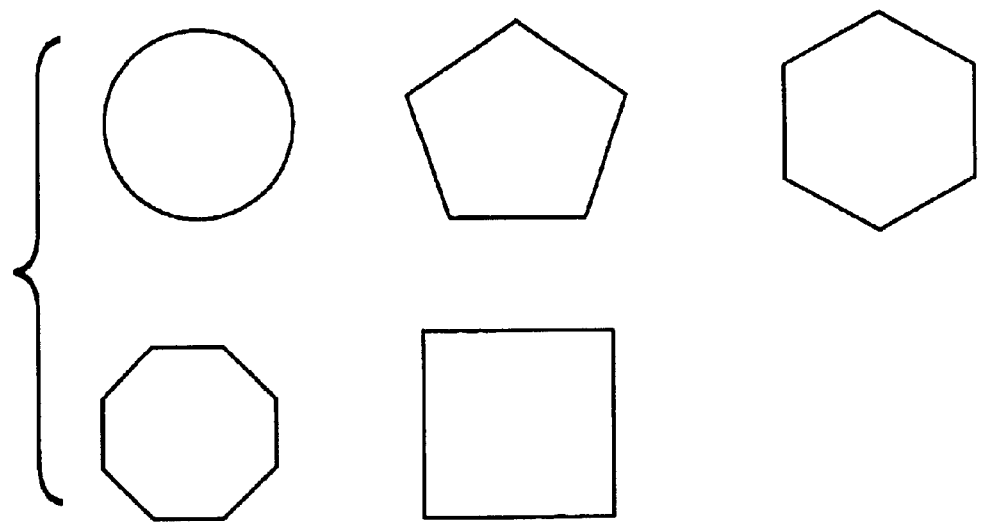
FIG. 10A and FIG. 10B are exemplary views showing the shape of electrodes that can be preferably used in a reflection liquid crystal display according to the invention.

Hereinafter, a detailed description is given of pixel electrodes used for the purpose of stabilizing the division boundary. FIG. 10A and FIG. 10B, FIG. 11A, FIG. 11B, FIG. 12A and FIG. 12B are exemplary plans showing the shapes of the electrodes, which are preferably used in a reflection liquid crystal display of the present invention. In the electrode shapes of the invention, a shape having better symmetry shows a circle or equilateral polygon which has more sides than those of a square as shown in FIG. 10A. If an electrode having such better symmetry is used, the electrode at the opposite side thereof is made wider than the electrode having better symmetry and is formed so as to cover the entirety of the upper part of the electrode having better symmetry, an oblique electric field having better symmetry may be produced between both the substrates when voltage is applied between both the electrodes, and the shift-down direction may be made double or more in liquid crystal whose dielectric anisotropy is negative and perpendicularly oriented, wherein the liquid crystal in pixels may be oriented and divided. That is, a division boundary is produced at the center of a pixel due to an oblique electric field that is naturally produced, and liquid crystal is shifted down from the edge of the pixel electrode to the middle thereof. Since the liquid crystal is naturally shifted down from respective sides of the pixel electrode to the middle if the shape of the pixel electrode is made symmetrical, the liquid crystal may be naturally divided. Also, a polygon is not necessarily equilaterally polygonal, and it may be deformed to some degree.

Figure 10B:
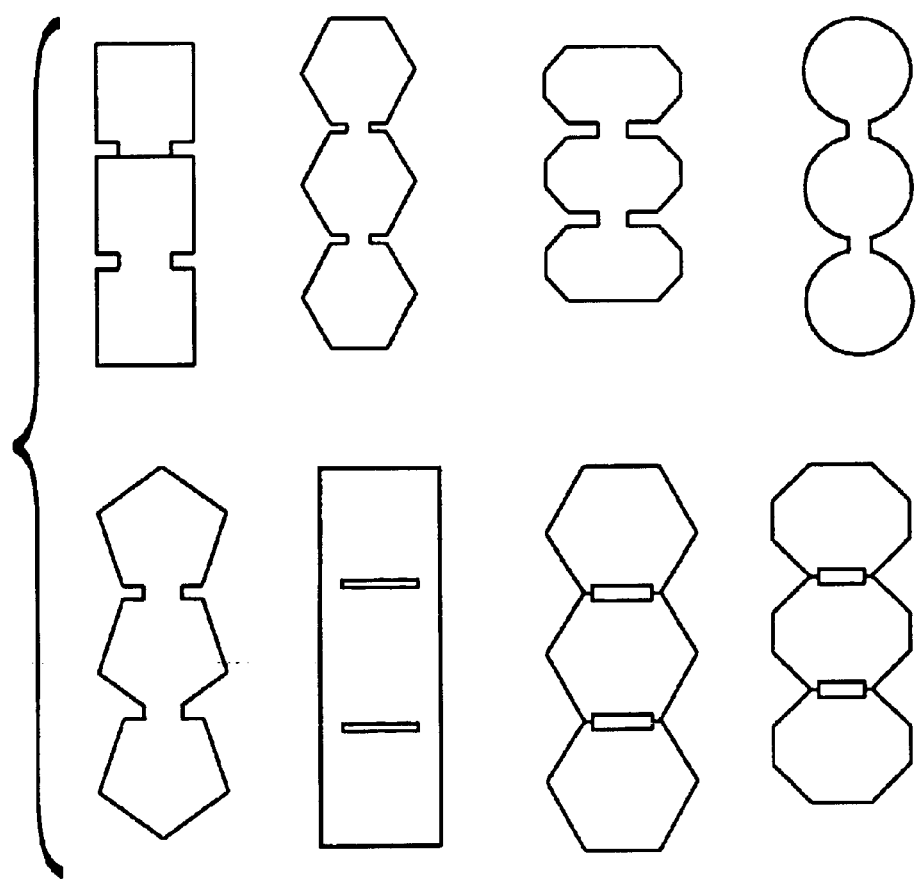

Also, in a normal reflection liquid crystal display, the pixel electrode is rectangular. However, as shown in FIG. 10B, if the electrode is provided with cuts and is formed so that a plurality of shapes having better symmetry as shown in FIG. 10A are linked with each other, orientation and division as described above can be carried out at portions that are shaped so as to have better symmetry. Therefore, it is possible to obtain effects similar to those of the electrode having better symmetry as a whole.

Figure 11A:
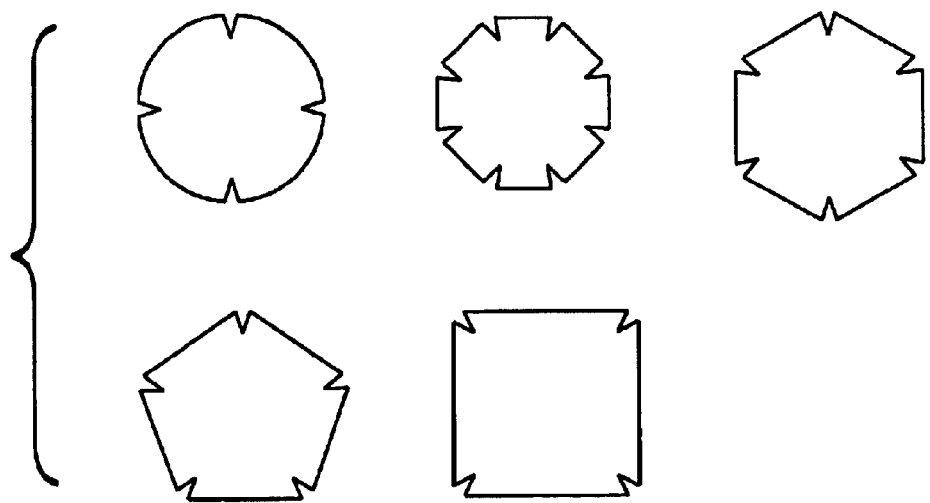
FIG. 11A and FIG. 11B are exemplary views showing the shape of electrodes that can be preferably used in a reflection liquid crystal display of the invention.
Figure 11B:
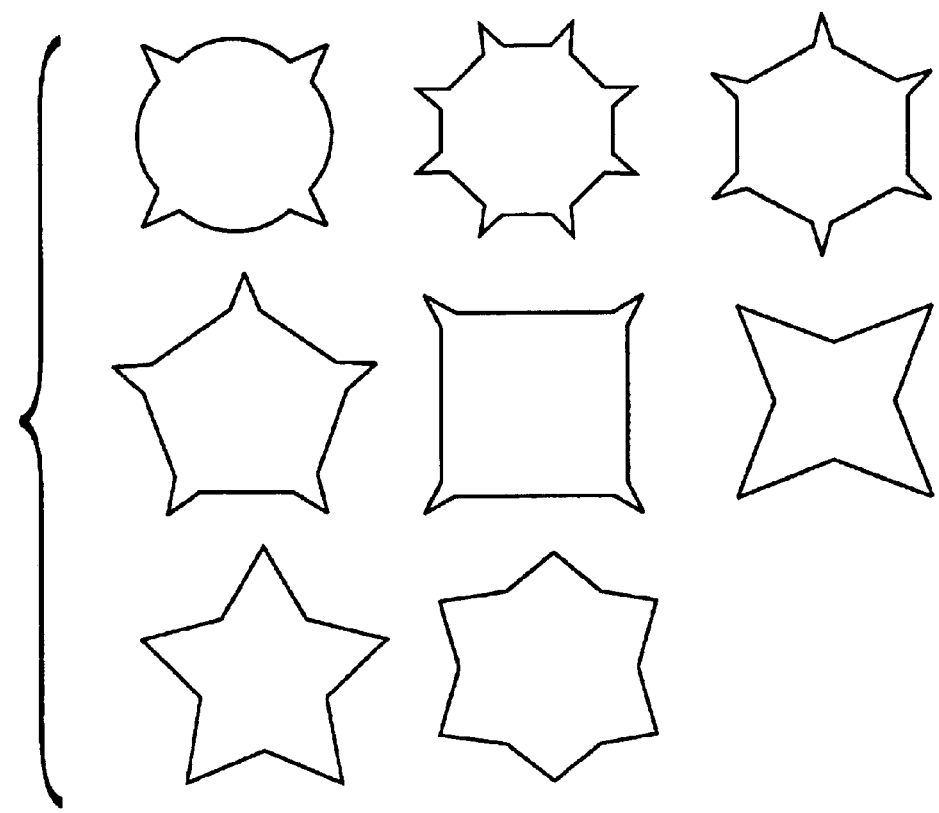
Figure 12A:
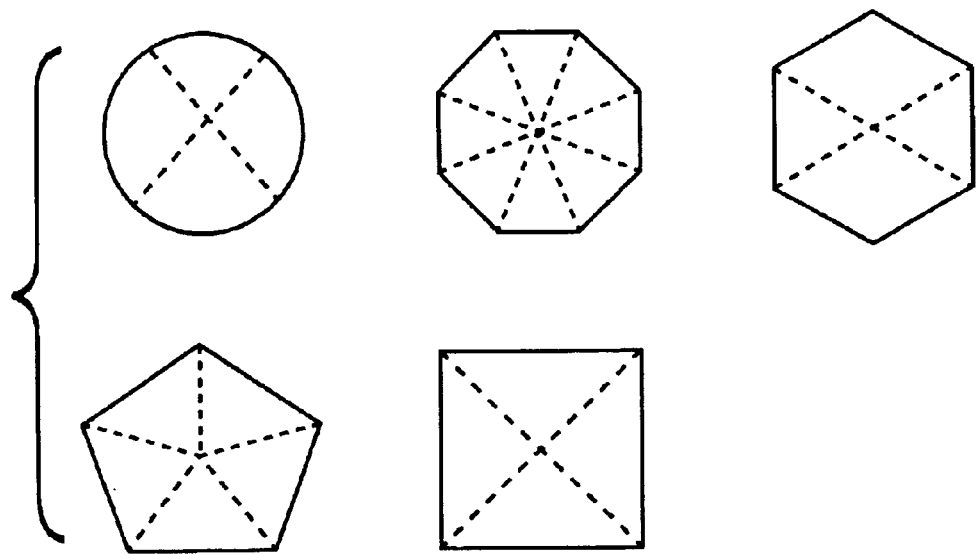
FIG. 12A and FIG. 12B are exemplary views showing the shape of electrodes that can be preferably used in a reflection liquid crystal display of the invention.
Figure 12B:
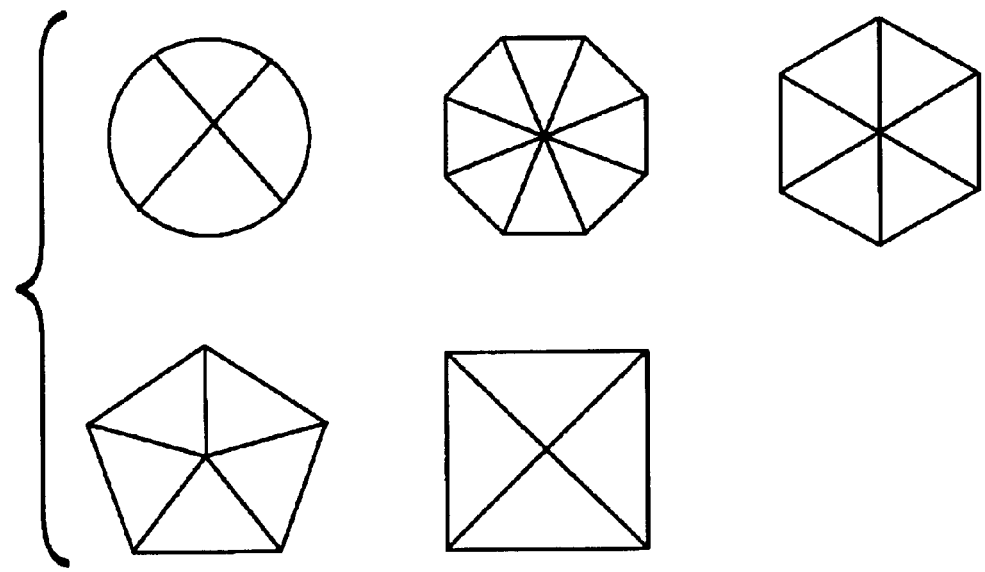

In order to further secure orientation and division, as shown in FIG. 11A, in a pixel electrode having better symmetry as shown in FIG. 10A, an electrode may be formed in a form that cuts are formed at equidistant positions on the circumference or at the corners of an equilateral polygon, and, as shown in FIG. 11B, projections protruding outward are provided at equidistant positions on the circumference of a pixel electrode having better symmetry as shown in FIG. 10A, or corners of an equilateral polygon, and, as shown in FIG. 12A, in the pixel electrode having better symmetry as shown in FIG. 10A, a circle is divided into a plurality of areas by segments passing from the center thereof to equidistant positions on the circumference of the circle, or an equilateral polygon is divided into a plurality of areas by segments passing from the center thereof to the corners thereof, wherein a part of these divided areas is removed, wherein an electrode having no pixel electrode may be formed. Still further, as shown in FIG. 12B, an electrode having better symmetry as shown in FIG. 10A is divided into a plurality of areas as in FIG. 12A, and a recess may be provided at a part of the divided areas. Also, these shapes may be combined.

In the case of a structure in which a recess is provided, it is possible to form a recess deeply without making the process of excavating an overcoat layer complicated, wherein the boundary may be further securely fixed. In addition, in the case of perpendicular orientation, when voltage is applied, the orientation may be stabilized like an eddy. However, the orientation can be further stabilized by feeding a chiral agent in order to make the response rate faster. Also, cuts at a part of said pixel or recess may be established to be like an eddy in the pixel.

Next, a description is given of a method for producing a reflection liquid crystal display according to the six embodiment of the invention.

First, by repeating a film forming process and lithography process, a substrate having an amorphous silicon thin-film transistor array (TFT) is formed on a glass substrate. The TFT may be composed of, for example, a gate chrome layer, silicon nitride-gate insulation layer, amorphous silicon-semiconductor layer and drain-source molybdenum layer in the order from the substrate side. Next, a protection film 617 made of, for example, SiNx, etc., is formed on the gate insulation film 621 so that it covers the drain electrode 620, source electrode 623 and semiconductor film 619. Thus, a substrate 607 is formed.

Next, an optical absorbing layer 606 is formed on the protection layer. A resin including a black dye or pigment may be used as an optical absorbing layer 606. Also, the optical absorbing layer 606 may be formed by using a metal. Next, a reflection layer 605 besides acting as a color filter consisting of a cholesteric material layer is formed. Such a cholesteric material layer may be formed of a cyloxane-based compound, whose chiral pitch is adjusted to an appointed color, as described in, for example, R. Mauer, D. Andrejewski, F-H. Kreuzer, A. Miller, SID90DIGEST pages 110–112 (1990), or a liquid crystal material having a photosensitive group as described in Liquid Crystals, Vol. No.18, page 319 (1995), whose chiral pitch is adjusted to an appointed color as well.

In order to form a reflection layer 605 besides acting as a color filter, first, an orientation film is coated on the protection layer 617 and is heated for burning. Further, as necessary, rubbing or processing for optical orientation is carried out. Next, a cyloxane-based compound whose chiral pitch has been adequately adjusted or a liquid crystal material having a photosensitive group whose chiral pitch has been adjusted to an appointed color is coated at an appointed thickness by using a laser blade, etc. After that, it is exposed to light by using a photo mask so that light is selectively irradiated onto an appointed area, that is, a pixel area disposed in the form of a matrix. After the exposure to light, the substrate is developed by using an appointed organic solvent, wherein an appointed pattern is formed. These processes are repeated three times equivalent to the liquid crystal layer having chiral pitches of three colors, for example, red, blue and green, and a color layer is left for the respective pixels, whereby a reflection layer 605 besides acting as a color filter consisting of a cholesteric material layer can be formed. At this time, if the chiral agent is made into, for example, a right-twisted chiral agent, the right-twisted cholesteric material layer can be formed.

Next, an overcoat layer 616 made of a transparent insulation material is formed on the reflection layer 605 besides acting as a color filter. The overcoat layer 616 may be made of, for example, a thermally hardening resin such as acrylate resin. Also, an optically hardening transparent resin may be used as the overcoat layer 616.

Finally, a throughhole 624 is formed, and a pixel electrode 615 that is connected to the source electrode 623 via the throughhole 624 is formed on the overcoat layer 616. If the pixel electrode 615 is formed to be a circle or equilateral polygon which has more sides than those of a square and has better symmetry, as described above, the division boundary of the liquid crystal layer 604 can be stabilized.

On the other hand, for example, ITO, etc., is spattered and patterned on the entire surface of the substrate made of, for example, transparent glass in order to form a common electrode 612, wherein a transparent substrate 603 that will become an opposed substrate of the first substrate 607 is formed. And, perpendicular orientation films 613a and 613b are, respectively, coated on the pixel electrode 615 and common electrode 613 of these substrates, and heated for drying. Further, a sealing agent is coated around these substrates. After a spacer agent of, for example, 4 μm of diameter, is sprayed, the sealing agent is hardened by heating, and nematic liquid crystal whose dielectric anisotropy is negative is poured, wherein the pouring port is sealed by an optically hardening resin.

Further, a wide-band quarter-wavelength plate 602, a polarization plate 601 on the wide-band quarter-wavelength plate, and scattering film 608 are formed on the side opposed to the side where the first substrate 607 of the transparent substrate 603 is disposed. At this time, the optical axis of the quarter-wavelength plate 602 is set so that the optical axis of the quarter-wavelength plate 602 and transmission axis of the polarization plate 601 come to an angle of 45 degrees clockwise or counterclockwise when being measured from the transmission axis of the polarization plate 601.

A panel of normally white mode, which is thus produced, can bring about excellent field-of-view angle characteristics in which no change in colors is caused to occur due to the angle, and the area of high contrast is made remarkably wide. Further, in adhering the upper and lower substrates together, there is no need to carry out alignment, and there is completely no problem even if the pixel size is decreased. In addition, the intensity of the reflection light is brighter than in prior arts, wherein no problem in parallax occurs. Also, in the case where a scattering film 608 is removed, a color tint changes in the polar angle direction exceeding ±20 degrees, and it is possible to change over a narrow field-of-view angle and a wide field-of-view angle by attaching and detaching the scattering film 608.

With the present invention, a remarkable effect is brought about especially in the case of an active matrix liquid crystal display in which a switching element such as a TFT is used. That is, in the case of an active matrix liquid crystal display, in liquid crystal display elements in which a normal TN mode is used, a micro-processing step such as a photo-resist processing, etc., is required only for one substrate in which active elements are produced. Usually, no micro-processing step is required in the other substrate that is called a common electrode, wherein an electrode is formed on the entirety of the surface thereof. Where an attempt is made to orient and divide liquid crystal in pixels, the photo-resist processing is increased in a prior art technology. An increase in the photo-resist processing results in an increase in load in the production facilities, and a lowering of yield. Therefore, it is preferable that such a micro-processing step such as a photo-resist processing is not required. Therefore, according to the embodiment, it is possible to orient and divide liquid crystal in pixels without any increase in the photo-resist processing.

In addition, especially, in the case of an active matrix liquid crystal display, there may be a case where an unnecessary disclination line enters the pixel electrode portion due to influences of a lateral electric field from the scanning signal electrode and picture signal electrode. Such a problem can be solved by increasing the distance between the scanning signal electrode, picture signal electrode and pixel electrode. However, an increase in the distance is not preferable in view of a ratio of opening where the pixel size is made small. Another method to solve this problem is to dispose a part of the pixel electrode or a shielding electrode on the upper part of at least either one of the scanning signal electrode or picture signal electrode. That is, the ratio of opening is lowered by shielding all the scanning signal electrode and picture signal electrode with the pixel electrode. Therefore, by disposing a pixel electrode or a shielding electrode on the upper part of at least either one of the scanning signal electrode or picture signal electrode, it is possible to prevent the ratio of opening from being lowered. In this case, when selecting an arrangement, the most favorable arrangement can be selected by taking into consideration the shape of a pixel, arrangement of the scanning signal electrode and picture signal electrode, and a sequence of forming the shielding electrode.

Still further, in the present invention, a pixel electrode is disposed between the reflection layer besides acting as a color filter and the liquid crystal layer, whereby since no alignment is required between the reflection layer besides acting as a color filter and the pixel electrode, the overlapping accuracy of the upper and lower substrates can be remarkably relieved. It is completely impossible to obtain such a remarkable effect in a technology in which an opening is provided at the common electrode. Also, by disposing a pixel electrode between the reflection layer besides acting as a color filter and the liquid crystal layer, it is possible to remarkably relieve the influences due to a lateral electric field from the scanning signal electrode and picture signal electrode.

Figure 13A:
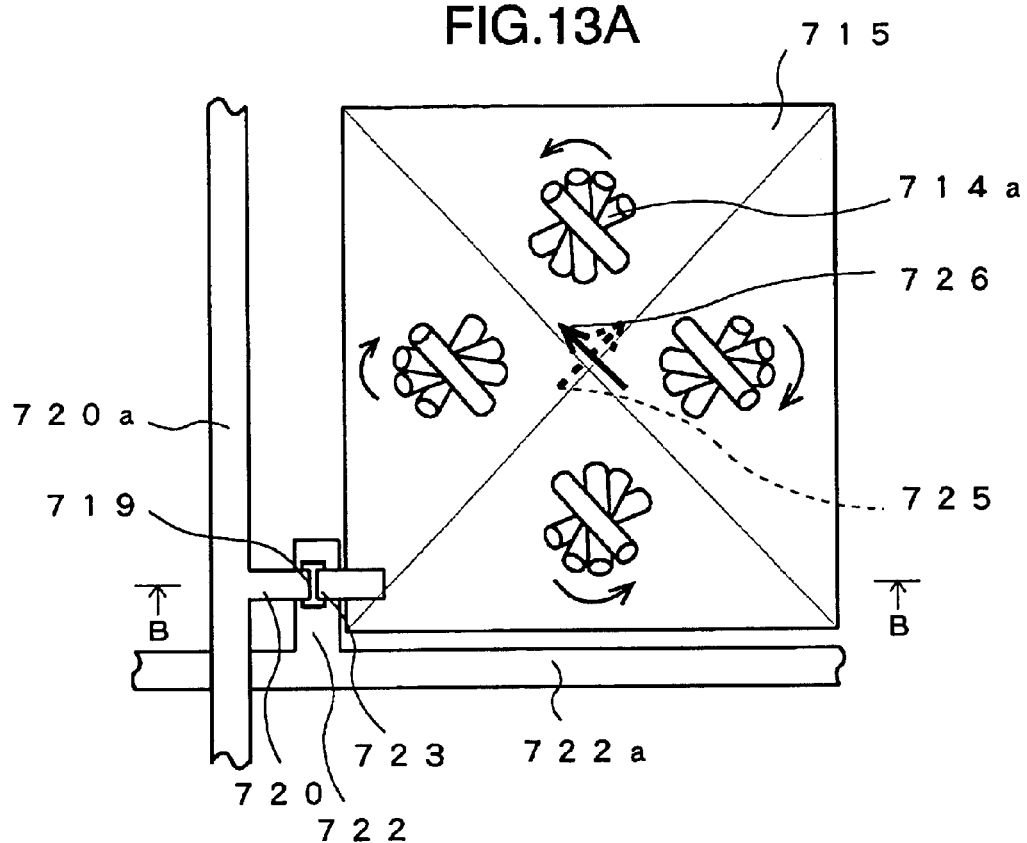
FIG. 13A is a plan view showing a reflection liquid crystal display according to a seventh embodiment of the invention.
Figure 13B:
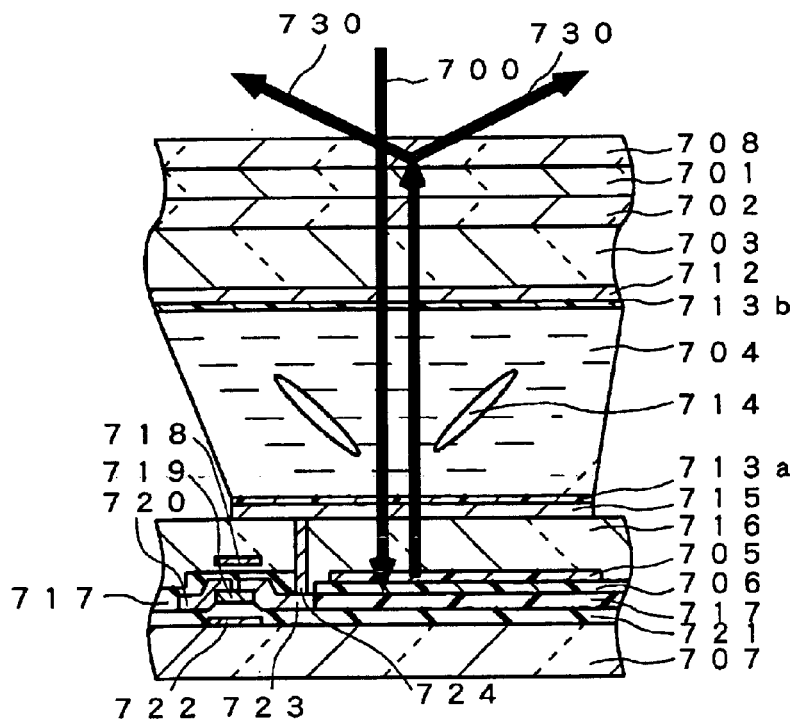
FIG. 13B is a cross-sectional view taken along the line B—B in FIG. 13A.

Next, a description is given of a seventh embodiment of the invention. FIG. 13A is a plan view showing a reflection liquid crystal display according to the seventh embodiment of the invention. FIG. 13B is a sectional view taken along the line B—B of FIG. 13A. FIG. 13A and FIG. 13B show a detailed structure in which liquid crystal is driven by an active element. A point at which the seventh embodiment differs from the sixth embodiment resides in that a liquid crystal layer is four-divided TN liquid crystal instead of perpendicularly oriented liquid crystal. As shown in FIG. 13A and FIG. 13B, the shape of a pixel electrode 715 in the embodiment is square. Other construction is similar to that of the sixth embodiment.

The embodiment shown in FIG. 13A and FIG. 13B shows an example in which the dielectric anisotropy of a liquid crystal layer 704 is negative and the liquid crystal is twisted-nematically oriented. Processes for rubbing and optical orientation are provided for a first substrate 707 and a transparent substrate 703, opposed thereto, which is disposed so that it comes forward to the first substrate 707 in the light-incident direction, wherein the direction of orientation of liquid crystal is regulated.

In the invention, an attempt is made to produce areas in which the rise directions of liquid crystal molecules 714 are different from each other, by using an oblique electric field. At this time, if the liquid crystal molecules 714 are provided with a pre-tilt angle, the liquid crystal molecules 714 are caused to rise in that direction, resulting in removal of the effect of an oblique electric field. As a result, no orientation and division is enabled. Therefore, in this case, it is preferable that the pre-tilt angle of the liquid crystal layer 704 is as small as possible, preferably 1 degree or less, further preferably zero. Such orientation can be easily obtained by using orientation films 713a and 713b that are oriented in a direction orthogonal to the rubbing direction, or irradiating polarized light to optical orientation films from the normal direction of a substrate. Also, no chiral agent is provided. In such a state, if voltage is applied between the upper and lower electrodes of the liquid crystal layer 704, that is, the common electrode 712 and pixel electrode 715, an oblique electric field can be produced, as described above, with better symmetry by the characteristics that the upper and lower electrodes have, wherein the liquid crystal is naturally divided into areas whose twisting direction and rise direction differ. There is a possibility that both right-twisting and left-twisting occur in respective parts of a pixel. However, in the case where, for example, a square pixel electrode 715 is formed as in the embodiment, an orientation direction 726 of a liquid crystal molecules 714a at the boundary of the transparent substrate 703 becomes, as shown in FIG. 13A, a position twisted by 90 degrees from an orientation direction 725 of the liquid crystal molecules at the boundary of the first substrate 707 by the oblique electric field. This is because at respective areas of a pixel, twisting in one direction is preferentially produced, and a state of orientation shown in FIG. 13A is automatically produced. That is, due to the effects of the electrode on the first substrate 707 being shaped so as to have better symmetry, the common electrode 712 on the transparent substrate 703 covering the entirety of the upper part f the pixel electrode 615 on the first substrate 707, and the common electrode 712 being wider than the pixel electrode 715, a pixel can be naturally divided with better symmetry in the case of the twisted-nematic orientation.

In order to further secure the division position, as shown in FIG. 11A, FIG. 11B, FIG. 12A and FIG. 12B, there are several methods, in which projections that protrude at the corners of the pixel electrode or outward at the surrounding thereof are provided, or cuts are provided at a part of the pixel electrode, or the pixel electrode is divided into a plurality of areas, and a portion having no pixel electrode is provided along the division boundary by removing a part of the areas. This is completely the same as in the example in which the dielectric anisotropy is negative.

The above example is based on a case where no chiral agent is provided. However, a chiral agent may be included. In this case, a two-division TN is brought about, in which only the rise direction differs, wherein it is possible to carry out orientation and division in the liquid crystal in a pixel.

Next, a description is given of actions of the embodiment. The retardation (dΔn) of a liquid crystal cell is adjusted so that, when no voltage is applied, the dΔn becomes equivalent to half a wavelength, that is, the phase difference becomes π. As in the sixth embodiment, a reflection layer 705 besides acting as a color filter consisting of a cholesteric material layer is right-twisted. As regards arrangement of a polarization plate 701 and a wide-band quarter-wavelength plate 702, a description is given of a case where the polarization plate 701 and the wide-band quarter-wavelength plate 702 are, as shown in FIG. 4, disposed so that the optical axis direction 902 of the quarter-wavelength plate 702 is inclined by 45 degrees clockwise with respect to the transmission axis direction 901 of the polarization plate 701, and incident light 700 is made into rightward circular-polarized light after it has passed through the polarization plate 701 and quarter-wavelength plate 702. In a state where no voltage is applied, as in the sixth embodiment, the incident light 700 is made into rightward circular-polarized light, and is converted to leftward circular-polarized light as it passes through the liquid crystal layer 704. Then, the light passes through the reflection layer 705 besides acting as a color filter consisting of a cholesteric material layer, and is absorbed by an optical absorbing layer 706. Therefore, the pixel is displayed to be black.

On the other hand, if a thin-film transistor (TFT) is turned on with voltage applied to a gate electrode 722, voltage is applied onto a source electrode 723, wherein an electric field is induced between the pixel electrode 715 and a common electrode 712 disposed so as to be opposed thereto. By the electric field, liquid crystal molecules 714 whose dielectric anisotropy is positive are caused to rise in a direction perpendicular to the substrate, wherein the retardation (dΔn) of liquid crystal becomes almost zero, the reflection light passes through the polarization plate 702, is scattered by the scattering plate 708, is made into radiation light 730 having an adequate field-of-view angle, and is observed by an observer's eyes.

Also, in order to further securely perform orientation and division, methods for polymerizing liquid crystal or altering the shape of the pixel electrode 715 are the same as those in the sixth embodiment. Also, a narrow field-of-view angle and a wide field-of-view angle can be easily changed over by attaching and detaching a scattering film 708 or providing or not providing a scattering property in a macromolecular dispersion liquid crystal layer 608. This is also the same as that of the sixth embodiment.

Figure 14A:
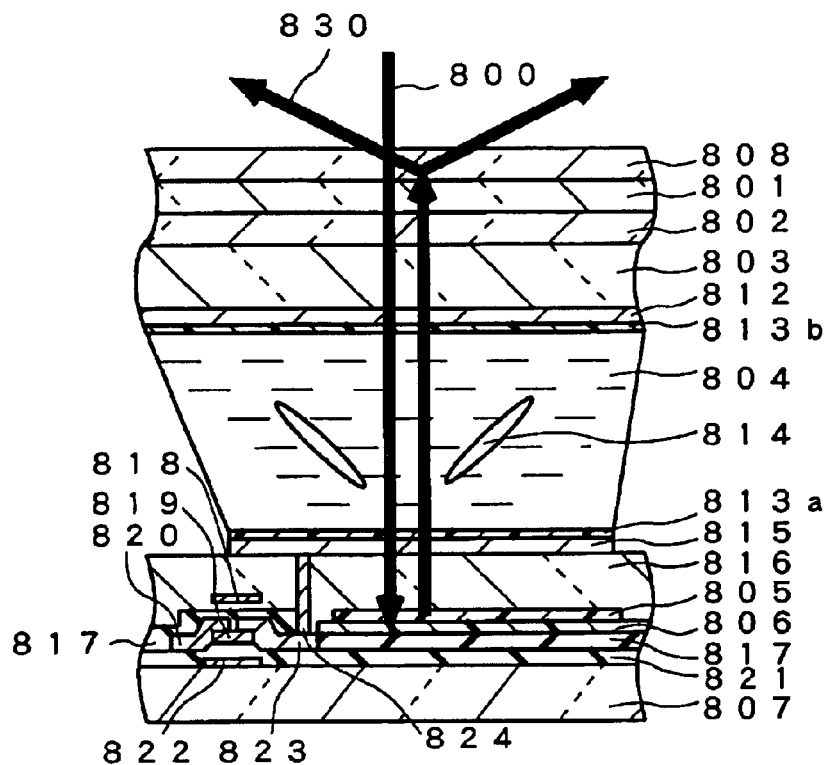
FIG. 14A is a sectional view showing a reflection liquid crystal display according to an eighth embodiment of the invention.
Figure 14B:
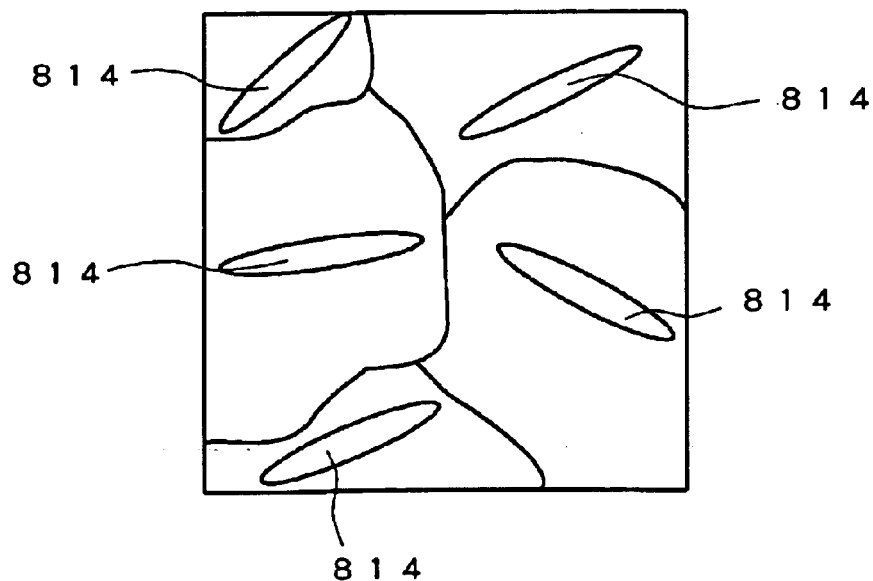
FIG. 14B is a plan view showing a liquid crystal layer of the present embodiment.

Next, a description is given of an eighth embodiment of the invention. FIG. 14A is a sectional view showing a reflection liquid crystal display according to the eighth embodiment of the invention, and FIG. 14B is a plan view showing a liquid crystal layer of the present embodiment. A point at which the present embodiment differs from the seventh embodiment resides in that a liquid crystal layer 804 is made of homogeneous liquid crystal (having no chiral agent) as shown in FIG. 14B instead of perpendicularly oriented liquid crystal. As shown in FIG. 14A, constructions other than the liquid crystal layer 804 are the same as those of the seventh embodiment.

In the embodiment, a horizontally oriented film is employed instead of a perpendicularly oriented film. There is no need to carry out any rubbing as in the perpendicularly oriented liquid crystal. ON and OFF of reflection light are made inverse of the case of perpendicular orientation when the dielectric anisotropy of liquid crystal is positive and no voltage is applied. That is, when no voltage is applied, the retardation (dΔn) of the liquid crystal layer is set to half a wavelength (phase difference is set to π). At this time, incident light 800 is absorbed by an optical absorbing layer 806 in the mechanism, which is similar to that of the seventh embodiment, and it is displayed to be black.

On the other hand, completely as in the seventh embodiment, if voltage is applied to a gate electrode 822 and a thin-film transistor (TFT) is turned on, voltage is applied to a source electrode 823, and an electric field is induced between a pixel electrode 815, which is formed on the surface at the rearward side in the light-incident direction of a liquid crystal layer 804, and a common electrode 812, which is formed on the surface at the forward side in the light-incident direction of the liquid crystal layer 804 so that it is opposed to the pixel electrode 815. By the electric field, a liquid crystal molecule 814 whose dielectric anisotropy is positive is caused to rise in a direction perpendicular to the substrate, wherein the retardation of the liquid crystal becomes almost 0, the reflection light passes through a polarization plate 801, is scattered by a scattering plate 808, and radiation light 830 enters an observer's eyes with an adequate field-of-view angle. At this time, since no orientation process is provided for orientation films 813a and 813b, the direction along which liquid crystal is caused to rise is random. However, since light reflected by the liquid crystal layer 804 that is displayed to be bright is circular-polarized light, brightness occurs regardless of the direction along which the liquid crystal rises, wherein a bright display is enabled. Also, by controlling the rise angle of liquid crystal by voltage application, it is possible to display intermediate colors.

In this case, as in the sixth and seventh embodiments, in view of the field-of-view angle characteristics when being used in a narrow field-of-view angle, uniformity of the brightness in a display screen, and response rate, it is preferable that the division is smoothly carried out, depending on liquid crystal materials and elements. In such a case, completely as in the sixth and seventh embodiments, by using the pixel electrode 815 having higher or better symmetry and designing the common electrode 812 so as to become larger than the pixel electrode 815, the orientation and division can be smoothly carried out. In order to more reliably carry out the division, at least either one of a drain electrode 820 or a gate electrode 822 is provided with a shielding electrode or is polymerized, a part of the pixel is provided with a cut, or a part of the pixel is removed, or a recess is provided at a part of the pixel electrode 815. Such measures may be carried out completely as in the sixth embodiment.

Figure 15A:
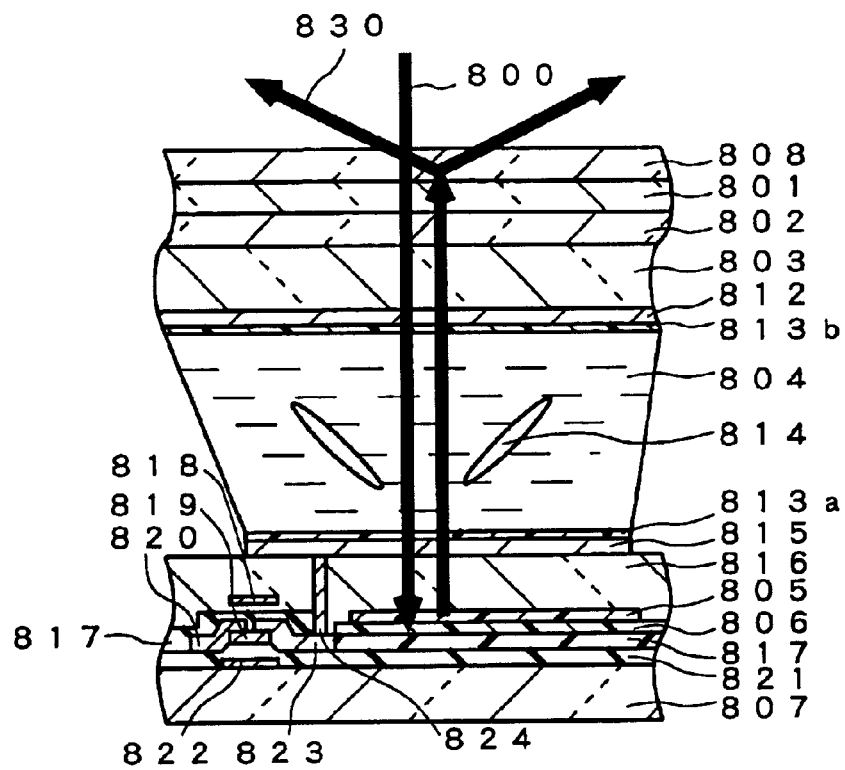
FIG. 15A is a sectional view showing a reflection liquid crystal display where the orientation direction of liquid crystal is regulated.
Figure 15B:
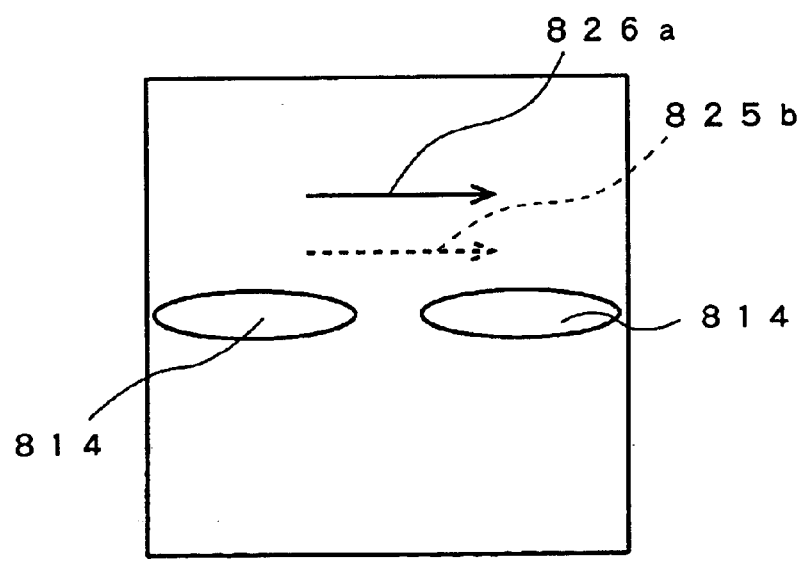
FIG. 15B is a plan view showing a liquid crystal layer of a reflection liquid crystal display shown in FIG. 15A.

Further, in a case where it is recommended that the orientation direction of liquid crystal be divided into two, the upper and lower substrates are processed by rubbing and optical orientation, and the orientation direction of the liquid crystal may be regulated. FIG. 15A is a sectional view showing a reflection liquid crystal display in the case where the orientation direction of liquid crystal is regulated, and FIG. 15B is a plan view showing a liquid crystal layer of the reflection liquid crystal display of FIG. 15A. As shown in FIG. 15B, by rubbing and optical orientation, the orientation direction 826a of the liquid crystal molecule 814 at the boundary of the transparent substrate 803 is the same as, and is parallel to the orientation direction 825b of the liquid crystal molecule 814 at the boundary of the first substrate 807. Thus, since the orientation direction of liquid crystal at the boundary of substrates is regulated, two types of domains whose rise directions are different from each other are produced.

In addition, when providing a part of a pixel with a cut, removing a part of the pixel, or providing a part of the pixel electrode with a recess, it is better that an orientation process such as rubbing, etc., which determines the azimuth angle direction is carried out in the direction along which the division can be smoothly carried out.

Figure 16A:
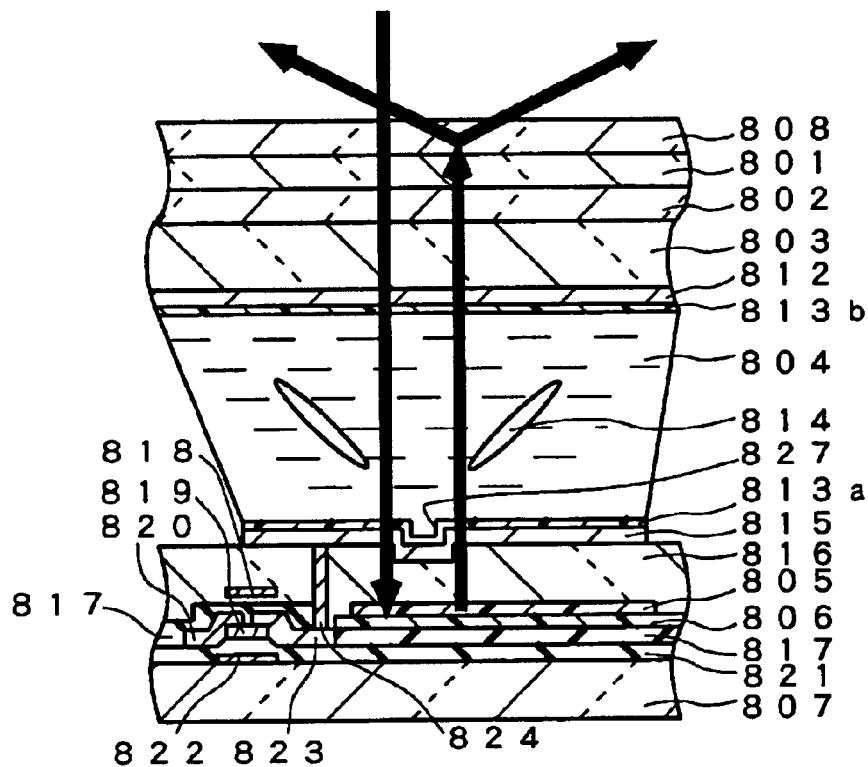
FIG. 16A is a sectional view showing a reflection liquid crystal display having a pixel electrode in which a recess is formed.
Figure 16B:
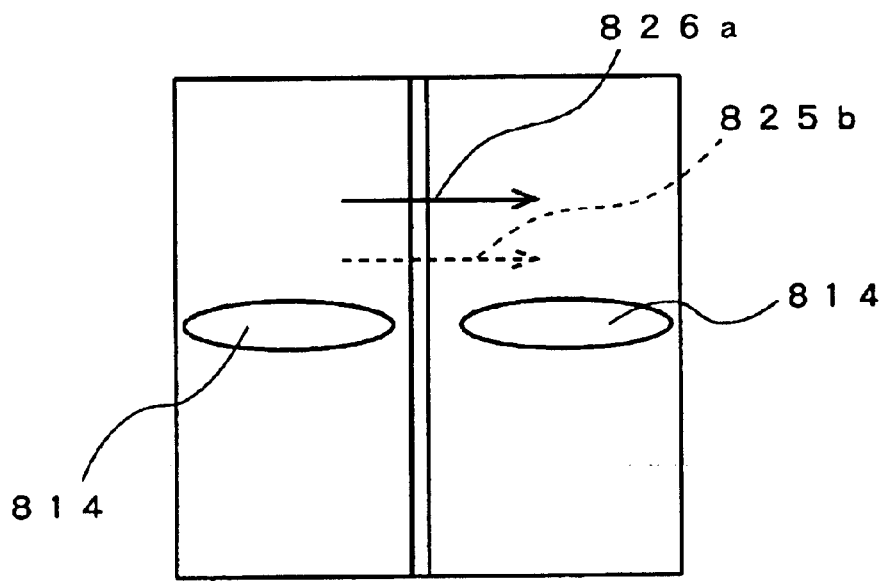
FIG. 16B is a plan view showing a liquid crystal layer of a reflection liquid crystal display of FIG. 16A.

In the case of homogeneous orientation, especially, in order to stabilize the boundary area, it is recommended that a recess is provided at the middle. Next, a description is given of the case where a recess is provided. FIG. 16A is a sectional view showing a reflection liquid crystal display having a pixel electrode in which a recess is formed, and FIG. 16B is a plan view showing a liquid crystal layer of the reflection liquid crystal display of FIG. 16A. As shown in FIG. 16B, it is shown that a recess 827 is provided in a direction orthogonal to the orientation direction at the middle portion of the pixel electrode 815. In FIG. 16B, 825b and 826b, respectively, denote the orientation directions of liquid crystal molecules 814 at the boundary of the first substrate 807 and at the boundary of the transparent substrate 803. Also, in this case, it is recommended that the pre-tilt angle is almost zero. Such orientation can be easily obtained by irradiating polarized light from the normal direction of the substrates onto an orientation film, which is oriented in the perpendicular direction from the rubbing direction, and an optical orientation film. Also, no chiral agent is provided. In such a state, if voltage is applied between the upper and lower electrodes of the liquid crystal layer 804, an oblique electric field is produced with better symmetry by the shape characteristics of the upper and lower electrode 815 and common electrode 812. Since the orientation direction of liquid crystal at the boundary of both substrates is regulated, two types of domains whose rise directions are different from each other are produced. In particular, in order to stabilize the boundary areas, in parallel to a side of the pixel electrode 815, a part of an electrode for pixel display is provided with a cut, a part of the electrode is removed or is provided with a recess. It is better that the initial orientation of liquid crystal is set so as to become perpendicular to the above measures.

EXAMPLES

Next, a description is given of the characteristics of a reflection liquid crystal display according to the examples of the invention, and their effects will also be described.

Example 1

A reflection liquid crystal display, which is similar to the sixth embodiment shown in FIG. 8, was fabricated. First, a film-forming process and a lithography process were repeated, wherein a gate chrome layer, a silicon nitride-gate insulation layer, a amorphous silicon-semiconductor layer, and a drain-source molybdenum layer were laminated from a substrate side. A substrate having an amorphous silicon thin-film transistor array (TFT) was prepared. Next, a protection layer made of SiNx was formed on the gate insulation film so that it covers the drain electrode, source electrode and semiconductor film. Next, an optical absorbing layer and a reflection layer besides acting as a color filter consisting of a cholesteric material layer were formed on the protection layer. Further, an orientation film was coated on the protection layer and was heated for burning. In addition, processes of rubbing and optical orientation were carried out. Next, a cyloxane-based compound whose chiral pitch was adequately adjusted was coated at appointed thickness by using a laser blade. Next, after the substrate was exposed to light by using a photo mask so that light is irradiated onto an appointed area, that is, is selectively irradiated onto pixel areas disposed in the form of a matrix, it was developed by using an appointed organic solvent, wherein an appointed pattern was formed. These processes were repeated three times on the liquid crystal having chiral pitches equivalent to three colors (red, blue and green), wherein a reflection layer besides acting as a color filter consisting of a cholesteric liquid crystal was formed by causing respective color layers to remain per pixel. At this time, a right-twisted chiral agent was used. Next, an overcoat layer made of an acrylate resin that is a transparent insulation material was formed on the reflection layer besides acting as a color filter. Finally, a throughhole was formed, and a pixel electrode having a rectangular shape, which is connected to the source electrode via the throughhole was formed on the overcoat layer.

A glass substrate having its entire surface spattered with ITO was prepared as an opposite substrate that is the second substrate, and a perpendicularly oriented film (Nissan Chemical Corp., SE1211) was coated on both the substrates. Then, they were heated for one hour at a temperature of 180° C. for drying. A sealing agent was coated around the substrates. After a spacer agent of 4 μm dia., was sprayed, the sealing agent was hardened by heating, and nematic liquid crystal (Merck, MLC6608) whose dielectric isotropy is negative was poured, and its pouring port was sealed with an optically hardening resin. A wide-band quarter-wavelength plate was formed outside the opposite substrate, and further a polarization plate was disposed so that the optical axis direction of the quarter-wavelength plate is inclined by 45 degrees clockwise with respect to the transmission axis direction of the polarization plate. A diffusion sheet having a scattering property was further provided thereon.

The field-of-view angle characteristics of a panel of a normally white mode, which had been thus obtained were measured. Excellent field-of-view angle characteristics, in which no change in color tint resulting from a degree of angle was recognized, having a remarkably wide high contrast area were obtained. Also, no alignment of the substrates was required when adhering the upper and lower substrates together, and it was found that there is no problem even if the size of a pixel is made smaller. In addition, the intensity of reflection light was brighter than that of prior arts, wherein it was found that an excellent capacity had been obtained with respect to the brightness. Further, it was found that no problem resides in relation to parallax.

Where the field-of-view angle characteristics were measured with the scattering sheet removed, the color tint was made different in the polar angle direction exceeding ±20 degrees, and a normal picture image could be recognized in only a narrow field-of-view angle.

Example 2

Another reflection liquid crystal display was formed in a state where the scattering sheet is changed to a macromolecular dispersion liquid crystal layer having ITO electrode formed on both sides, and all other constructions are the same as those of Example 1. Then, the field-of-view angle characteristics were measured. As a result, excellent field-of-view angle characteristics having a remarkably wide and high contrast area, in which no change in color tint is provided at an angle of observation when no voltage is applied, were obtained. Also, the brightness is the same as that of Example 1, wherein bright display could be obtained.

Next, where voltage was applied onto the macromolecular dispersion liquid crystal layer, a picture image could be recognized in only a narrow field-of-view angle as in Example 1.

Example 3

A TFT substrate having a reflection layer besides acting as a color filter consisting of a cholesteric material layer was prepared completely as in the case of Example 1. A glass substrate having ITO spattered on its entire surface was prepared as an opposite substrate completely as in the case of Example 1. A horizontally oriented film (JSR Corp., AL1051) was coated on both the substrates, and the substrates were heated for one hour at a temperature of 180° C. for drying. Also, by adequately leaving a reflection layer, besides acting as a color filter, and an overcoat layer on the gate wiring and drain wiring on the TFT substrate instead of spraying a spacer agent, posts whose sizes were 10 μm long, 20 μm wide, and 2 μm high were formed. A sealing agent was coated around the substrates. The upper and lower substrates are adhered to each other, wherein the sealing agent was hardened by heating, and nematic liquid crystal (Merck, TL-213) whose dielectric anisotropy was positive was poured without mixing any chiral agent. The pouring port was sealed by an optically hardening resin.

Completely as in Example 1, a wide-band quarter-wavelength plate and a polarization plate were formed outside the opposite substrate. At this time, the optical axis was set so as to establish 45 degrees clockwise when being measured from the transmission axis of the polarization plate. A diffusion sheet having a scattering property was installed thereon.

The field-of-view angle characteristics of a panel of a normally black mode, which had been thus obtained were measured. Completely as in Example 1, excellent field-of-view angle characteristics, in which no change in color tint resulting from a degree of angle of observation was recognized, having a remarkably wide high contrast area was obtained. Also, the intensity of transmission light was brighter than that of prior arts, completely as in Example 1, wherein it was found that an excellent capacity had been obtained with respect to the brightness.

Also, as in Example 1, where the field-of-view angle characteristics were measured with the scattering sheet removed, the color tint was made different in the polar angle direction exceeding ±20 degrees, and a normal picture image could be recognized in only a narrow field-of-view angle.

Example 4

A TFT substrate was prepared, in which the shape of a pixel electrode is shaped so that three squares are lined up one after another. Also, a liquid crystal material having a photosensitive group was used as cholesteric liquid crystal. All other constructions are the same as those in Example 1, wherein vertical liquid crystal was poured, and after the pouring port was sealed, a quarter-wavelength plate, polarization plate, and a diffusion sheet were adhered to the opposite substrate side.

The field-of-view angle characteristics of a panel of a normally white mode, which had been thus obtained were measured. Completely as in Example 1, excellent field-of-view angle characteristics, in which no change in color tint resulting from a degree of angle was recognized, having a remarkably wide high contrast area were obtained. Also, the response rate was made faster than that in Example 1.

Next, also, as in Example 1, where the field-of-view angle characteristics were measured with the scattering sheet removed, field-of-view angle characteristics having excellent uniformity on the entire panel were obtained in comparison with Example 1. Also, as in the case of Example 1, a normal picture image could be recognized in only a narrow field-of-view angle, in comparison with the case where a scattering film is provided.

Example 5

Completely as in the case of Example 1, a TFT substrate having a reflection layer besides acting as a color filter consisting of a cholesteric material layer was prepared. Completely as in the case of Example 1, a glass substrate having ITO spattered on its entire surface was prepared as an opposite substrate. A horizontally oriented film (JSR Corp., AL1051) was coated on both the substrates, and the substrates were heated at a temperature of 180° C. for one hour for drying. As in Example 1, a sealing agent was coated around the substrates, and after a spacer agent of 6 μm of diameter was sprayed, the sealing agent was hardened by heating, wherein nematic liquid crystal (Merck Corp., ZLI-4792) whose dielectric anisotropy is positive and chiral pitch is adjusted to 6 μm (right-twisted) was poured, and the pouring port was sealed by an optically hardening resin.

Completely as in the case of Example 1, a wide-band quarter-wavelength plate and a polarization plate were set outside the opposite substrate in order, so that, with respect to the optical axis of the quarter-wavelength plate and transmission axis of the polarization plate, the optical axis of the quarter-wavelength plate is positioned at 45 degrees clockwise when being measured from the transmission axis of the polarization plate. A diffusion sheet having a scattering property was provided thereon.

The field-of-view angle characteristics of a panel of a normally white mode, which had been thus obtained were measured. Excellent field-of-view angle characteristics, in which no change in color tint resulting from a degree of angle was recognized in an angle of observation, having a remarkably wide high contrast area were obtained. Also, with respect to the brightness, as in Embodiment 1, it was found that an excellent capacity could be obtained.

Also, where the field-of-view angle characteristics were measured with the scattering sheet removed, the color tint became completely different in the polar angle direction exceeding ±20 degrees as in the case of Embodiment 1, and a normal picture image could be recognized in only a narrow field-of-view angle.

Example 6

Completely as in the case of Example 5, a TFT substrate having a reflection layer besides acting as a color filter consisting of a cholesteric material layer was prepared. A glass substrate having ITO spattered on its entire surface was prepared as an opposite substrate. A horizontally oriented film (JSR Corp., AL1051) was coated on both the substrates, and the substrates were heated at a temperature of 180° C. for one hour for drying. Herein, rubbing was carried out, as in conventional TN, with its rubbing direction inclined by 45 degrees from the side of the panel and turned by 90 degrees toward the upper and lower substrates, and as in Example 5, a sealing agent was coated around the substrates. After a spacer agent of 2 $\mu$m of diameter was sprayed, the sealing agent was hardened by heating. A nematic liquid crystal (Merck Corp., TL-213) whose dielectric anisotropy is positive and chiral pitch is adjusted to be 30 $\mu$m (right-twisted) was poured, and the pouring port was sealed by an optically hardening resin. Also, the rubbing direction was set so that a 90-degree twisted direction brings about normal orientation.

Completely as in Example 5, a wide-band quarter-wavelength plate and a polarization plate were formed outside the opposite substrate. At this time, they were set so that the optical axis of the quarter-wavelength plate is turned by 45 degrees clockwise when being measured from the transmission axis of the polarization plate. A diffusion sheet having a scattering property was provided thereon.

The field-of-view angle characteristics of a panel of a normally black mode, which had been thus obtained were measured. Excellent field-of-view angle characteristics, in which no change in color tint resulting from a degree of angle of observation was recognized, having a remarkably wide high contrast area were obtained. Also, as in Example 1, excellent performance could be obtained with respect to the brightness. Further, the response rate was also excellent, being reflected by a narrow gap.

Also, where the field-of-view angle characteristics were measured with the scattering sheet removed, a change in color tint occurred at 15 degrees in the downward direction of the panel, and the field-of-view angle became remarkably narrow.

Example 7

By a method that is similar to that in Example 1, a TFT substrate in which the shape of a pixel electrode is made square was prepared. Completely as in the case of Example 1, a glass substrate having ITO spattered on its entire surface was prepared as an opposite substrate. A horizontally oriented film (JSR Corp., JALS-428) was coated on both the substrates, and the substrates were heated at a temperature of 180° C. for one hour for drying. Herein, as in Embodiment 6, rubbing was carried out with its rubbing direction inclined by 45 degrees from the side of the panel and turned by 90 degrees toward the upper and lower substrates, and as in Example 6, a sealing agent was coated around the substrates. After a spacer agent of 6 $\mu$m dia., was sprayed, the sealing agent was hardened by heating. A nematic liquid crystal (Merck Corp., ZLI-4792) whose dielectric anisotropy is positive and chiral agent is removed was poured, and the pouring port was sealed by an optically hardening resin. Thereby, when voltage was applied, one pixel is naturally divided into four areas, whose rise directions and twisting directions are different from each other, by an oblique electric field.

Completely as in Example 1, a wide-band quarter-wavelength plate was formed outside the opposite substrate, and further a polarization plate was disposed so that the optical axis direction of the quarter-wavelength plate could be inclined by 45 degrees clockwise with respect to the transmission axis direction of the polarization plate. A diffusion sheet having a scattering property was provided thereon.

Where the field-of-view angle characteristics of a panel of a normally black mode, which had been thus obtained were measured, excellent field-of-view angle characteristics free from any inverted graduation, in which the area of high contrast is remarkably wide, could be obtained. Also, as in Example 1, it was found that the performance regarding brightness was excellent.

In addition, where the field-of-view angle characteristics were measured with the scattering sheet removed, the color tint was made different in the polar angle direction exceeding ±20 degrees as in the case of Embodiment 1, and a normal picture image could be recognized in only a narrow field-of-view angle.

Example 8

Completely as in Example 1, a TFT substrate in which the shape of a pixel electrode is made square, and a recess is formed by digging the overcoat layer at the middle part of the pixel as in the eighth embodiment shown in FIG. 12A and FIG. 12B, was prepared. Completely as in the case of Example 1, a glass substrate having ITO spattered on its entire surface was prepared as an opposite substrate. In addition, as in Example 7, a horizontally oriented film (JSR Corp., JALS-428) was coated on both the substrates, and the substrates were heated at a temperature of 180° C. for one hour for drying. Rubbing was performed on the substrates along the long side of the recess. In the oriented film, the liquid crystal was oriented in the rubbing direction and perpendicular direction, that is, directions 825b and 826b in FIG. 12B, and the pre-tilt angle was almost zero degrees. As in Example 3, by adequately leaving a reflection layer, besides acting as a color filter, and an overcoat layer on the gate wiring and drain wiring instead of spraying a spacer agent, posts whose sizes were 10 $\mu$m long, 20 $\mu$m wide, and 2 $\mu$m high were formed. A sealing agent was coated around the substrates. The upper and lower substrates are adhered to each other, wherein the sealing agent was hardened by heating, and nematic liquid crystal (Merck, TL-213) whose dielectric anisotropy was positive was poured without mixing any chiral agent. The pouring port was sealed by an optically hardening resin. As in Example 3, a wide-band quarter-wavelength plate and a polarization plate were set outside the opposite substrate in order, so that, with respect to the optical axis of the quarter-wavelength plate and transmission axis of the polarization plate, the optical axis of the quarter-wavelength plate was set so as to establish 45 degrees clockwise when being measured from the transmission axis of the polarization plate. A diffusion sheet having a scattering property was installed thereon.

The field-of-view angle characteristics of a panel of a normally black mode, which had been thus obtained were measured. Completely as in Example 1, excellent field-of-view angle characteristics, in which no change in color tint resulting from a degree of angle of observation was recognized, having a remarkably wide high contrast area were obtained. Also, the intensity of transmission light was bright in comparison with prior arts completely as in Example 1, wherein it was found that an excellent capacity has been obtained with respect to the brightness.

Also, as in Example 1, where the field-of-view angle characteristics were measured with the scattering sheet removed, the color tint was made different in the polar angle direction exceeding ±20 degrees, and a normal picture image could be recognized in only a narrow field-of-view angle.

Example 9

A wide-band quarter-wavelength plate was formed outside the opposite substrate of liquid crystal cells having a reflection layer, besides acting as a color filter consisting of a cholesteric material layer, which was prepared as in Example 1. Further, the polarization plate was disposed so that the optical axis direction of the quarter-wavelength plate is inclined by 45 degrees clockwise with respect to the transmission axis direction of the polarization plate. Still further, a diffusion sheet having a scattering property was provided thereon. The twisting of the cholesteric material layer is reverse of that of the reflection layer besides acting as a color filter consisting of a cholesteric material layer. That is, a left twisting was employed.

Then, the field-of-view angle characteristics were measured. The results, which are the same as those of Example 1, were obtained. If a scattering film is provided, the field-of-view angle is wide, and if a scattering sheet is removed, the field-of-view angle is made narrow. Also, the brightness was higher than prior art liquid crystal elements.

Example 10

By a method that is similar to that of Example 1, a reflection layer besides acting as a color filter consisting of a cholesteric material layer, and a three-prime-color cholesteric material layer were formed inside the liquid crystal cell. Example 10 is different from Example 9 in that a three-prime-color cholesteric material layer is formed inside the liquid crystal cell. That is, the three-prime-color cholesteric material layer was prepared on a glass substrate of the opposite substrate by a method that is similar to that of Example 1. After an overcoat layer was coated, ITO was formed. The glass substrate was used as the opposite substrate. As in Example 1, where a liquid crystal panel was prepared, and the field-of-view angle characteristics of the panel that had been thus obtained were measured, excellent field-of-view angle characteristics, in which no change in color tint is provided as in the case of Example 1 and the area of high contrast is remarkably wide could be obtained. Also, where the field-of-view angle characteristics were measured with the scattering sheet removed, a normal picture image could be recognized in only a narrow field-of-view angle as in the case of Example 1. Further, the brightness was almost the same as that of prior art liquid crystal display elements.

What is claimed is:

1. A reflection liquid crystal display comprising:
    a first substrate;
    a second transparent substrate that is disposed forward to a light-incident direction so that it is opposed to said first substrate;
    a liquid crystal layer placed between said first and second substrates;
    a color filtering layer consisting of a cholesteric material layer secured between said first substrate and said liquid crystal layer;
    an optical absorbing layer provided rearward of said color filtering layer in the light-incident direction between said first substrate and said color filtering layer;
    a quarter-wavelength plate secured at a side of said second substrate forward of said second substrate in said light-incident direction; and
    a polarization plate disposed further forward in the light-incident direction than said quarter-wavelength plate.

2. The reflection liquid crystal display as set forth in claim 1, further comprising a scattering layer for scattering light forward to said polarization plate in the light-incident direction.

3. The reflection liquid crystal display as set forth in claim 2, wherein said scattering layer includes:
    two transparent electrodes opposed to each other; and
    a macromolecular dispersion liquid crystal layer placed between said transparent electrodes;
    wherein transmission and scattering of said macromolecular dispersion liquid crystal layer are switched by applying voltage to said macromolecular dispersion liquid crystal layer.

4. The reflection liquid crystal display as set forth in claim 1, further comprising:
    a plurality of scanning signal lines secured on the surface of said first substrate opposed to said second substrate;
    a plurality of picture signal lines disposed on these scanning signal lines in the form of a matrix;
    a plurality of thin-film transistors formed so as to correspond to the intersection of said scanning signal lines and said picture signal lines;
    at least one pixel that is constituted by an area surrounded by said plurality of scanning signal lines and picture signal lines;
    pixel electrodes that are connected to said thin-film transistor corresponding to respective pixels and are formed rearward of said liquid crystal layer in the incident direction of light; and
    a common electrode that is formed forward of said liquid crystal layer in the incident direction of light and applies a reference voltage to said plurality of pixels.

5. The reflection liquid crystal display as set forth in claim 4, wherein at least either one of said scanning electrode or a picture signal electrode is provided with a part of said pixel electrode and a shielding electrode forward in the light-incident direction.

6. The reflection liquid crystal display as set forth in claim 4, wherein said pixel electrode is circular or equilaterally polygonal to have more sides than those of a triangle;
    a common electrode has a larger area than that of said pixel electrode when being observed from upside, and is formed at a position where said common electrode covers the entirety of said pixel electrode.

7. The reflection liquid crystal display as set forth in claim 4, wherein said pixel electrode is shaped so that a plurality of circles or equilateral polygons which have more sides than those of a triangle are connected to each other; and said common electrode has a larger area than that of said pixel electrode when being observed from upside, and is formed at a position where said common electrode covers the entirety of said pixel electrode.

8. The reflection liquid crystal display as set forth in claim 6, wherein said common electrode is formed on almost the entire surface of said second substrate.

9. The reflection liquid crystal display as set forth in claim 7, wherein said common electrode is formed on almost the entire surface of said second substrate.

10. The reflection liquid crystal display as set forth in claim 6 wherein said pixel electrode has cuts formed at equidistant positions on its circumference or at respective corners of an equilateral polygon.

11. The reflection liquid crystal display as set forth in claim 7 wherein said pixel electrode has cuts formed at equidistant positions on its circumference or at respective corners of an equilateral polygon.

12. The reflection liquid crystal display as set forth in claim 6, wherein said pixel electrode has projections formed at equidistant positions on its circumference or at respective corners of an equilateral polygon, which protrudes outward therefrom.

13. The reflection liquid crystal display as set forth in claim 7, wherein said pixel electrode has projections formed at equidistant positions on its circumference or at respective corners of an equilateral polygon, which protrudes outward therefrom.

14. The reflection liquid crystal display as set forth in claim 4, wherein a recess is formed at a part of said pixel electrode.

15. The reflection liquid crystal display as set forth in claim 1, wherein said liquid crystal layer includes a macro-molecular organic compound.

16. The reflection liquid crystal display as set forth in claim 1, wherein said liquid crystal layer has negative dielectric anisotropy in liquid crystal, and liquid crystal molecules are oriented in a direction orthogonal to said first and second substrates when no voltage is applied.

17. The reflection liquid crystal display as set forth in claim 16, wherein said liquid crystal layer is given a pre-tilt angle in advance in a direction along which the liquid crystal molecules are shifted down when voltage is applied.

18. The reflection liquid crystal display as set forth in claim 1, wherein said liquid crystal layer has positive dielectric anisotropy in liquid crystal and has a twisted nematic structure when no voltage is applied.

19. The reflection liquid crystal display as set forth in claim 18, wherein said liquid crystal layer in respective pixels has two types of minute areas whose rise directions of liquid crystal molecules are different from each other.

20. The reflection liquid crystal display as set forth in claim 18, wherein said liquid crystal layer in respective pixels has two types of minute areas whose twisting directions of liquid crystal molecules are different from each other.

21. The reflection liquid crystal display as set forth in claim 18, wherein said liquid crystal layer in respective pixels has four types of minute areas whose twisting directions and rise directions of liquid crystal molecules are different from each other.

22. The reflection liquid crystal display as set forth in claim 18, wherein the pre-tilt angle of liquid crystal molecules at the boundary phase between said first substrate and second substrate is 1 degree or less.

23. The reflection liquid crystal display as set forth in claim 1, wherein said liquid crystal layer has positive dielectric anisotropy in liquid crystal, and has a homogenous structure when no voltage is applied.

24. The reflection liquid crystal display as set forth in claim 23, wherein said liquid crystal layer in respective pixels has two types of minute areas whose rise directions of liquid crystal molecules are different from each other.

25. The reflection liquid crystal display as set forth in claim 24, wherein the pre-tilt angle of liquid crystal molecules at the boundary phase between said first substrate and second substrate is 1 degree or less.

* * * * *